US012364139B2

(12) United States Patent
Hamade et al.

(10) Patent No.: US 12,364,139 B2
(45) Date of Patent: Jul. 15, 2025

(54) ELECTRO-OPTICAL DEVICE AND ELECTRONIC APPARATUS

(71) Applicant: SEIKO EPSON CORPORATION, Tokyo (JP)

(72) Inventors: Yuiga Hamade, Matsumoto (JP); Jun Irobe, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 468 days.

(21) Appl. No.: 17/975,603

(22) Filed: Oct. 28, 2022

(65) Prior Publication Data

US 2023/0140126 A1  May 4, 2023

(30) Foreign Application Priority Data

Oct. 28, 2021 (JP) ................. 2021-176211

(51) Int. Cl.
*H10K 59/38* (2023.01)
*H10K 59/131* (2023.01)
*H10K 59/35* (2023.01)
*H10K 59/80* (2023.01)

(52) U.S. Cl.
CPC ........... *H10K 59/38* (2023.02); *H10K 59/131* (2023.02); *H10K 59/353* (2023.02)

(58) Field of Classification Search
CPC ............. H10K 59/38; H10K 59/353; H10K 59/80518; H10K 59/876; H10K 59/878
See application file for complete search history.

(56) References Cited

U.S. PATENT DOCUMENTS

| 12,035,565 B2* | 7/2024 | Fukuchi ............ G03G 15/04036 |
| 2010/0026173 A1* | 2/2010 | Lhee .................... H10K 71/166 |
| | | 445/24 |
| 2016/0056203 A1* | 2/2016 | Kim ................... G02F 1/133514 |
| | | 257/89 |
| 2019/0035862 A1 | 1/2019 | Koshihara |
| 2020/0212109 A1* | 7/2020 | Lee .................... H10K 59/8792 |
| 2020/0295090 A1* | 9/2020 | Cho ........................ H10K 50/82 |
| 2021/0359018 A1* | 11/2021 | Koshihara ............ H10K 59/878 |

(Continued)

FOREIGN PATENT DOCUMENTS

JP  2019117941  7/2019

*Primary Examiner* — Mohsen Ahmadi
(74) *Attorney, Agent, or Firm* — JCIPRNET

(57) ABSTRACT

An electro-optical device includes, in plan view, a light-emitting region B that emits blue light, a coloring layer Cf_B that transmits the blue light, a light-emitting region G1 that is disposed adjacent to the light-emitting region B in a Y direction and emits green light, a coloring layer Cf_G that is provided overlapping the light-emitting region G1 and transmits the green light, a light-emitting region R that is disposed adjacent to the light-emitting region G1 in an X direction and emits red light, a coloring layer Cf_R that is provided overlapping the light-emitting region R and transmits the red light, a light-emitting region G2 that is disposed adjacent to the light-emitting region G1 in an E direction and emits green light, and a coloring layer Cf_G that is provided overlapping the light-emitting region G2 and transmits the green light, wherein the coloring layer Cf_B includes a region that overlaps the light-emitting region B in plan view, and a region located between the light-emitting regions G1 and G2 in plan view.

9 Claims, 15 Drawing Sheets

(56) References Cited

U.S. PATENT DOCUMENTS

| | | | |
|---|---|---|---|
| 2022/0037416 A1* | 2/2022 | Irobe | H10K 50/858 |
| 2022/0059806 A1* | 2/2022 | Ko | H10K 59/8792 |
| 2023/0320162 A1* | 10/2023 | Joo | H10K 59/877 |
| | | | 257/40 |
| 2024/0008333 A1* | 1/2024 | Han | H10K 59/131 |
| 2024/0074272 A1* | 2/2024 | Kubota | H10K 59/876 |

* cited by examiner

|  | Δu'v' | | |
|---|---|---|---|
|  | Y-Z | X-Z | E-Z |
| EMBODIMENT | < 0.02 | < 0.02 | < 0.02 |
| REFERENCE EXAMPLE | < 0.02 | < 0.02 | > 0.02 |

ELECTRO-OPTICAL DEVICE AND ELECTRONIC APPARATUS

BACKGROUND

The present application is based on, and claims priority from JP Application Serial Number 2021-176211, filed Oct. 28, 2021, the disclosure of which is hereby incorporated by reference herein in its entirety.

1. Technical Field

The present disclosure relates to an electro-optical device and an electronic apparatus.

2. Related Art

In an electro-optical device using, for example, an OLED as a light-emitting element, a technology in which a coloring layer that transmits light in a predetermined wavelength range, that is, a color filter, is provided on a sealing layer that covers a light-emitting element in order to realize color display is known. "OLED" is an abbreviation for "organic light-emitting diode". In such an electro-optical device, a color of one dot is represented by pixel portions corresponding to a plurality of colors, typically a red pixel portion, a green pixel portion, and a blue pixel portion.

An area of each of a light-emitting region in the red pixel portion, a light-emitting region in the green pixel portion, and a light-emitting region in the blue pixel portion is often determined in consideration of light emission efficiency, visibility, life of a light-emitting layer, and the like.

For example, in a technology described in JP-A-2019-117941, a configuration in which a red light-emitting region is assigned to one of four octagonal regions arranged in two rows and two columns to express a color of one dot, a green light-emitting region is assigned to another, and a blue light-emitting region is assigned to the remaining two is described. Specifically, in the two-row and two-column array, two blue light-emitting regions are assigned to diagonal positions, and the red light-emitting region and the green light-emitting region are assigned to the remaining two positions.

When a distance between adjacent coloring layers in such an arrangement is different, a color change increases in accordance with a viewing angle, and thus, in the technology described in JP-A-2019-117941, a contact region is provided at a position overlapping an intersection point between boundary lines that separate the light-emitting regions in plan view. As a result, a distance between the light-emitting regions becomes almost uniform, and the color change due to the viewing angle is suppressed.

However, in the technology described in JP-A-2019-117941, the color change due to the viewing angle in a row or column direction is suppressed, but the light-emitting regions of the same color and the coloring layers of the same color are continuous in an oblique direction. Therefore, in the technology described in JP-A-2019-117941, there is a problem that a degree of color change is different in the row (transverse) or column (longitudinal) direction and in the oblique direction.

SUMMARY

An electro-optical device according to an aspect of the present disclosure includes, in plan view, a first light-emitting region configured to emit light in a first wavelength range, a first coloring layer configured to transmit the light in the first wavelength range, a second light-emitting region disposed adjacent to the first light-emitting region in a first direction and configured to emit light in a second wavelength range, a second coloring layer provided overlapping the second light-emitting region and configured to transmit the light in the second wavelength range, a third light-emitting region disposed adjacent to the second light-emitting region in a second direction and configured to emit light in a third wavelength range, a third coloring layer provided overlapping the third light-emitting region and configured to transmit the light in the third wavelength range, a fourth light-emitting region disposed adjacent to the second light-emitting region in a third direction intersecting the first direction and the second direction and configured to emit the light in the second wavelength range, and a fourth coloring layer provided overlapping the fourth light-emitting region and configured to transmit the light in the second wavelength range, wherein the first coloring layer includes a first region that overlaps the first light-emitting region in plan view, and a second region located between the second light-emitting region and the fourth light-emitting region in plan view.

DESCRIPTION OF EXEMPLARY EMBODIMENTS

An electro-optical device according to an embodiment of the present disclosure will be described below with reference to the accompanying drawings. In each of the drawings, dimensions and scale of each part are appropriately different from actual ones. Moreover, the embodiment described below is a suitable specific example, and various technically preferable limitations are applied, but the scope of the disclosure is not limited to these modes unless they are specifically described in the following description as limiting the disclosure.

Electro-Optical Device According to Embodiment

Figure 1:
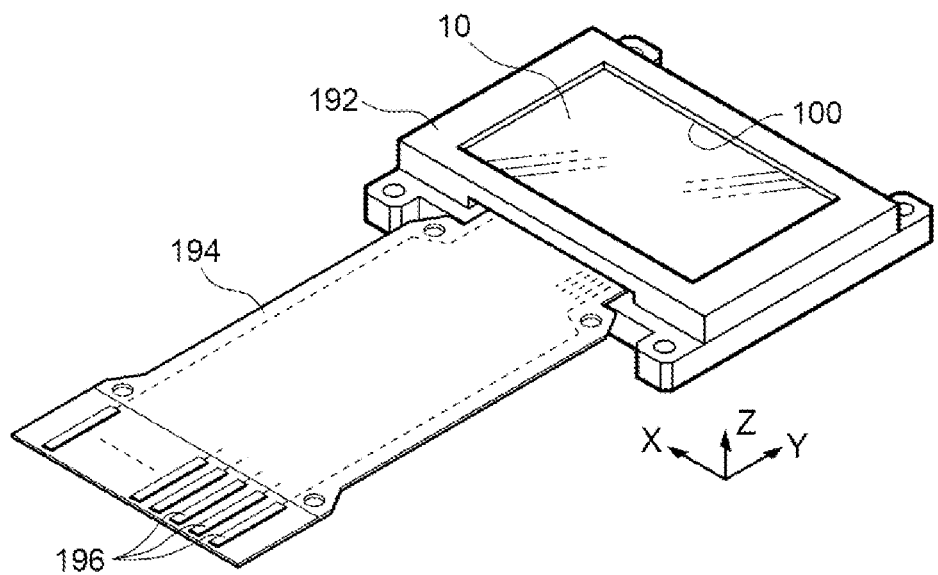
FIG. 1 is a view illustrating a configuration of an electro-optical device according to an embodiment.
Figure 2:
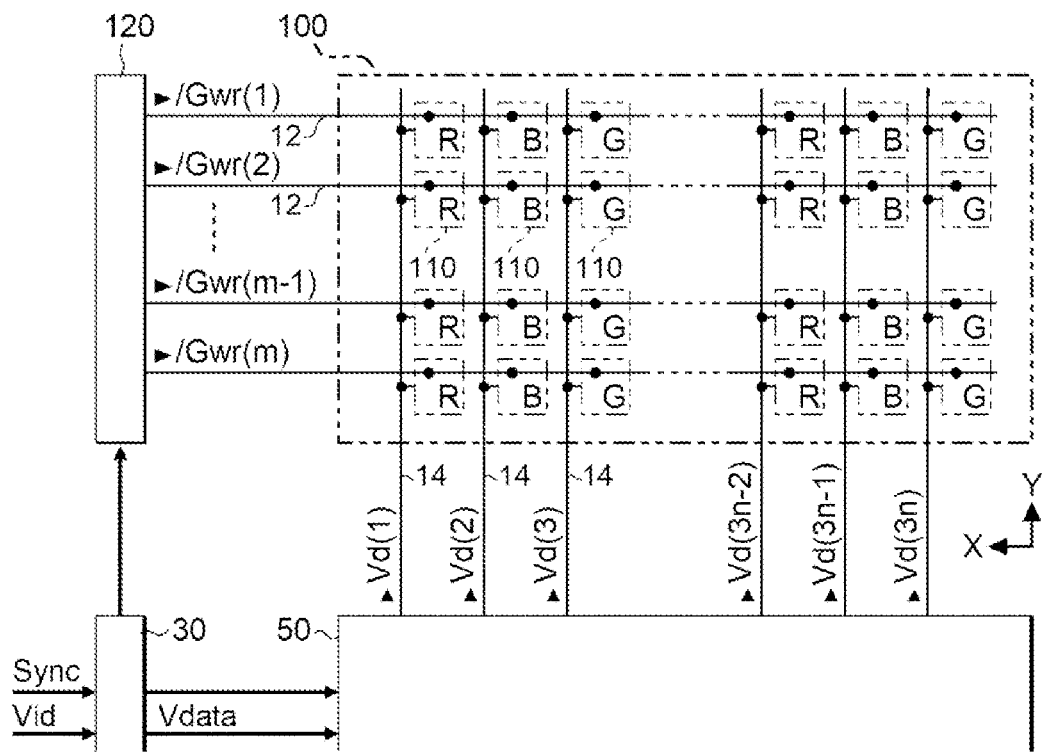
FIG. 2 is a block diagram illustrating an electrical configuration of the electro-optical device.

FIG. 1 is a perspective view illustrating an electro-optical device 10 according to an embodiment, and FIG. 2 is a block diagram illustrating an electrical configuration of the electro-optical device 10.

The electro-optical device 10 is a micro display panel that displays a color image, for example, in a head-mounted display (HMD) or the like. The electro-optical device 10 includes a plurality of pixel portions, a drive circuit that drives the pixel portions, and the like. The pixel portions and the drive circuit are integrated into a semiconductor substrate. The semiconductor substrate is typically a silicon substrate, but may be a different semiconductor substrate.

The electro-optical device 10 is accommodated in a frame-shaped case 192 that opens in a display region 100. One end of an FPC substrate 194 is coupled to the electro-optical device 10. "FPC" is an abbreviation for "flexible printed circuit". A plurality of terminals 196 for coupling a host device, which is not illustrated, are provided on the other end of the FPC substrate 194. When the plurality of terminals 196 are coupled to the host device, video data, synchronization signals, and the like are supplied from the host device to the electro-optical device 10 via the FPC substrate 194.

In the drawings, an X direction is an extension direction of a scanning line in the electro-optical device 10 and indicates a transverse direction on a display screen, and a Y direction is an extension direction of a data line and indicates a longitudinal direction on the display screen. A two-dimensional plane defined in the X direction and the Y direction is a substrate surface of a semiconductor substrate. A Z direction is perpendicular to the X direction and the Y direction and is an emission direction of light emitted from a light-emitting element. Further, in the description, in plan view, the semiconductor substrate is seen in a direction opposite to the Z direction, and in a cross-sectional view, the semiconductor substrate is seen in a state in which the semiconductor substrate is cut in a vertical direction of a substrate surface.

As illustrated in FIG. 2, the electro-optical device 10 is substantially divided into a control circuit 30, a data signal output circuit 50, a display region 100, and a scanning line drive circuit 120.

In the display region 100, scanning lines 12 of m rows are provided in the X direction, and data lines 14 of (3 n) columns are provided in the Y direction to be electrically insulated from each of the scanning lines 12. Each of m and n is an integer equal to or greater than 2.

In the display region 100, pixel portions 110 are provided corresponding to intersections between the scanning lines 12 of the m rows and the data lines 14 of the (3 n) columns. Thus, the pixel portions 110 are arranged in a matrix of m longitudinal rows x (3 n) horizontal columns. To distinguish the rows from each other in the array of the matrix, the rows may be referred to as first, second, third, . . . , (m-1)-th, and m-th rows in order from the top in the drawing. Similarly, to distinguish the columns from each other in the matrix, the columns may be referred to as first, second, third, . . . , (3n-2), (3n-1)-th, and (3N)-th columns in order from the left in the drawing.

An integer i of 1 or more and m or less is used to generalize and explain the scanning lines 12. Similarly, in order to generalize and explain the data lines 14, an integer j of 1 or more and (3 n) or less is used.

The control circuit 30 controls each portion based on video data Vid and a synchronization signal Sync supplied from the host device which is not illustrated. Specifically, the control circuit 30 generates various control signals to control each portion.

The video data Vid designates, for example, a gradation level of a pixel in an image to be displayed by 8 bits. The synchronization signal Sync includes a vertical synchronization signal that instructs a start of vertical scanning of the video data Vid, a horizontal synchronization signal that instructs a start of horizontal scanning, and a dot clock signal that indicates a timing of one pixel of the video data.

Pixels of an image to be displayed in the present embodiment and the pixel portions 110 in the display region 100 correspond one-to-one with each other.

Characteristics of a luminance at a gradation level indicated by video data Vid supplied from the host device and characteristics of a luminance in the OLED included in the pixel portion 110 do not necessarily coincide with each other. Thus, to make the OLED emit light at a luminance corresponding to the gradation level indicated by the video data Vid, the control circuit 30 up-converts 8 bits of the video data Vid into, for example, 10 bits and outputs it as video data Vdata. Thus, the 10-bit video data Vdata is data corresponding to the gradation level designated by the video data Vid.

A look-up table in which a correspondence relationship between the 8 bits of the video data Vid which is an input and the 10 bits of the video data Vdata which is an output is stored in advance is used in the up-conversion.

The scanning line drive circuit 120 is a circuit for driving the pixel portions 110 arranged in m rows and (3n) columns for each row corresponding to control by the control circuit 30. For example, the scanning line drive circuit 120 supplies scanning signals /Gwr(1), /Gwr(2), /Gwr(m-1), /Gwr(m) to the scanning lines 12 of first, second, third, . . . , (m-1)-th, and m-th rows in order. To generalize, the scanning signal supplied to the scanning line 12 in the i-th row is denoted as /Gwr(i).

The data signal output circuit 50 is a circuit that outputs a data signal to the pixel portions 110 located in a row selected by the scanning line drive circuit 120 via the data line 14 corresponding to the control of the control circuit 30. The data signal is a voltage signal that converts the 10-bit video data Vdata into an analog type. In other words, the data signal output circuit 50 converts video data Vdata of one row corresponding to the pixel portions 110 of first to (3n)-th columns in the selected row into an analog type and outputs the analog type data to the data lines 14 of the first to (3n)-th columns in order.

In the drawings, the data signals output to the data lines 14 of the first, second, third, . . . , (3n-2)-th, (3n-1)-th, and (3n)-th columns are referred to as Vd(1), Vd(2), Vd(3), Vd(3n-2), Vd(3n-1), and Vd(3n). To generalize, a potential of the data line 14 of a j-th column is denoted as Vd(j).

As illustrated in FIG. 2, in the pixel portions 110 of the display region 100, from an electrical point of view, the pixel portions 110 of R, the pixel portions 110 of B, and the pixel portions 110 of G are arranged in the X direction, and the pixel portions 110 of the same color are arranged in the Y direction. Thus, focusing on some data lines 14 in one column, the pixel portions 110 of the same color correspond to each other. One color is expressed by an additive color mixture of the pixel portions 110 of the RBG adjacent to each other in the X direction. Thus, the pixel portion 110 should be referred to as a sub-pixel portion in a strict sense, but for convenience of explanation, the pixel portion 110 is designated as a pixel portion.

Figure 5:
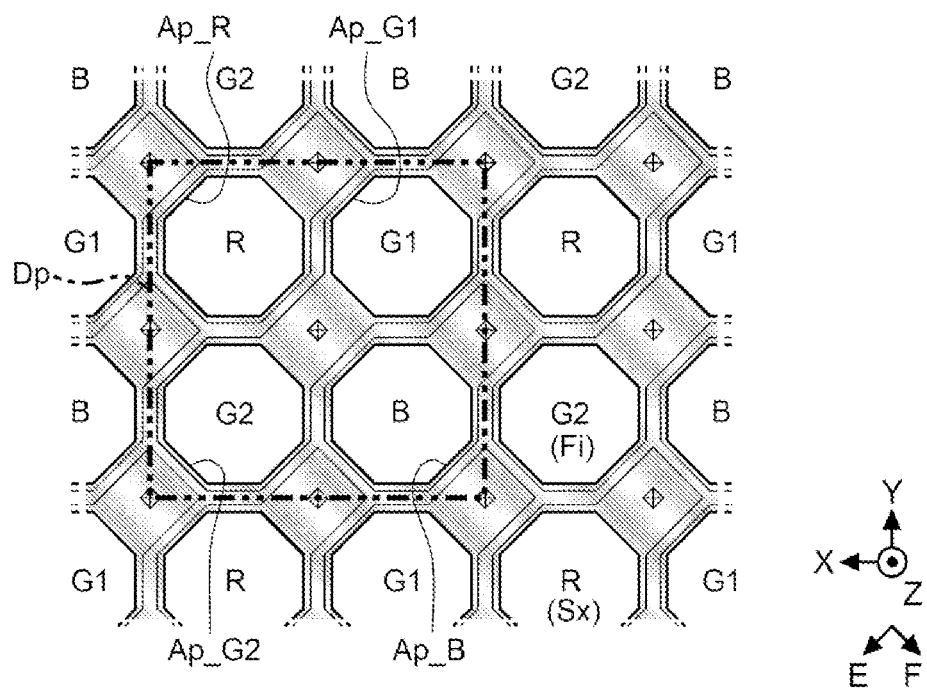
FIG. 5 is a plan view illustrating an arrangement of a pixel portion in the electro-optical device.

Further, the arrangement of the pixel portion 110 illustrated in FIG. 2 is only an electrical point of view, and in reality, as illustrated in FIG. 5 which will be described later, a light-emitting region in the pixel portion of each color is disposed.

Figure 3:
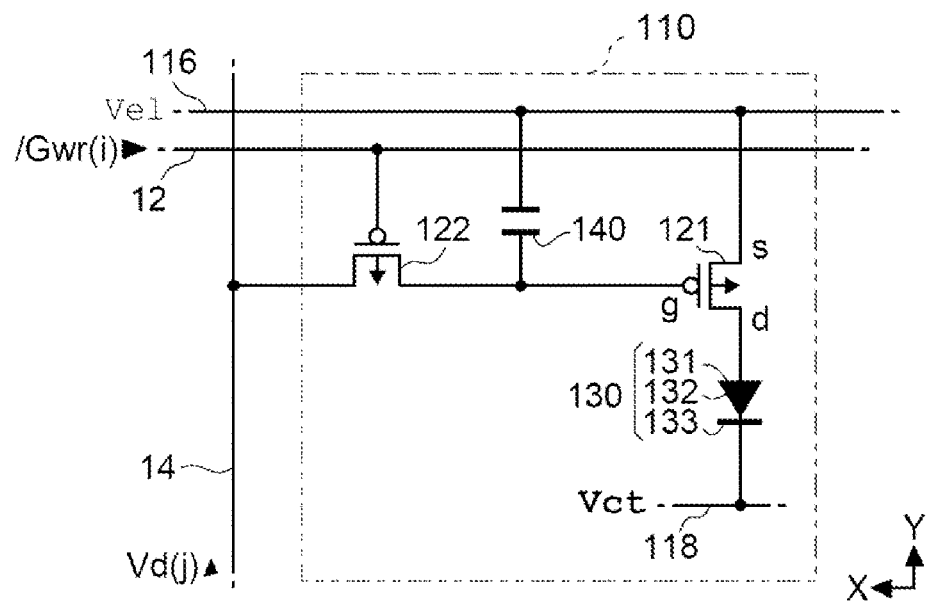
FIG. 3 is a circuit diagram illustrating a pixel portion in the electro-optical device.

FIG. 3 is a diagram illustrating an electrical configuration of the pixel portion 110 in the electro-optical device 10. The pixel portions 110 arranged in 1080 rows and (3n) columns are electrically identical to each other. Therefore, the pixel portion 110 will be described with one pixel portion 110 corresponding to an i-th row and a j-th column as a representative.

As illustrated in the drawing, the pixel portion 110 includes P-channel MOS type transistors 121 and 122, an OLED 130, and a capacitive element 140 from the electrical point of view.

In the description of the pixel portion 110, the "electrical point of view" is used when a plurality of elements constituting the pixel portion 110 and a coupling relationship between the plurality of elements are referred to. Since the pixel portion 110 includes elements that do not contribute to the electrical coupling relationship from a mechanical or physical point of view, such an expression is used.

The OLED 130 is an example of a light-emitting element in which a light-emitting layer 132 is sandwiched between a pixel electrode 131 and a common electrode 133. The pixel electrode 131 functions as an anode, and the common electrode 133 functions as a cathode. The details of the OLED 130 will be described later, and when a current flows from the anode to the cathode, holes injected from the anode and electrons injected from the cathode are recombined in the light-emitting layer 132 to generate excitons, and white light is generated.

The generated white light resonates in an optical resonator configured of a reflective electrode omitted in FIG. 3 and the common electrode 133 of a semi-reflective and semi-transmissive layer and is emitted at a resonance wavelength set corresponding to any of red, green, and blue. A color filter corresponding to the color is provided on the emission side of the light from the optical resonator. Thus, the emitted light from the OLED 130 is visually recognized by an observer through coloration by the optical resonator and the color filter.

In the transistor 121 of the pixel portion 110 in the i-th row and the j-th column, a gate node g is coupled to a drain node of the transistor 122, a source node s is coupled to a feed line 116 of a voltage Vel, and a drain node d is coupled to the pixel electrode 131 which is an anode of the OLED 130.

In the transistor 122 of the pixel portion 110 in the i-th row and the j-th column, a gate node is coupled to the scanning line 12 of the i-th row, and a source node is coupled to the data line 14 of the j-th column. The common electrode 133 which functions as a cathode of the OLED 130 is coupled to a feed line 118 of a voltage Vct. Further, since the electro-optical device 10 is formed on a silicon substrate, a substrate potential of each of the transistors 121 and 122 is set to a potential corresponding to, for example, the voltage Vel.

Because the pixel portion 110 illustrated in FIG. 3 is common to each of red, green, and blue from the electrical point of view, it will be generally described without identifying the color, but it is different for each color from a structural point of view. Therefore, when the colors are described separately, the pixel portion 110 is referred to as pixel portions 110R, 110G, and 110B. Similarly, when the OLED 130 and the pixel electrode 131 are described separately by color, the OLED 130 is referred to as OLEDs 130R, 130G, and 130B and the pixel electrode 131 is referred to as pixel electrodes 131R, 131G, and 131B.

Figure 4:
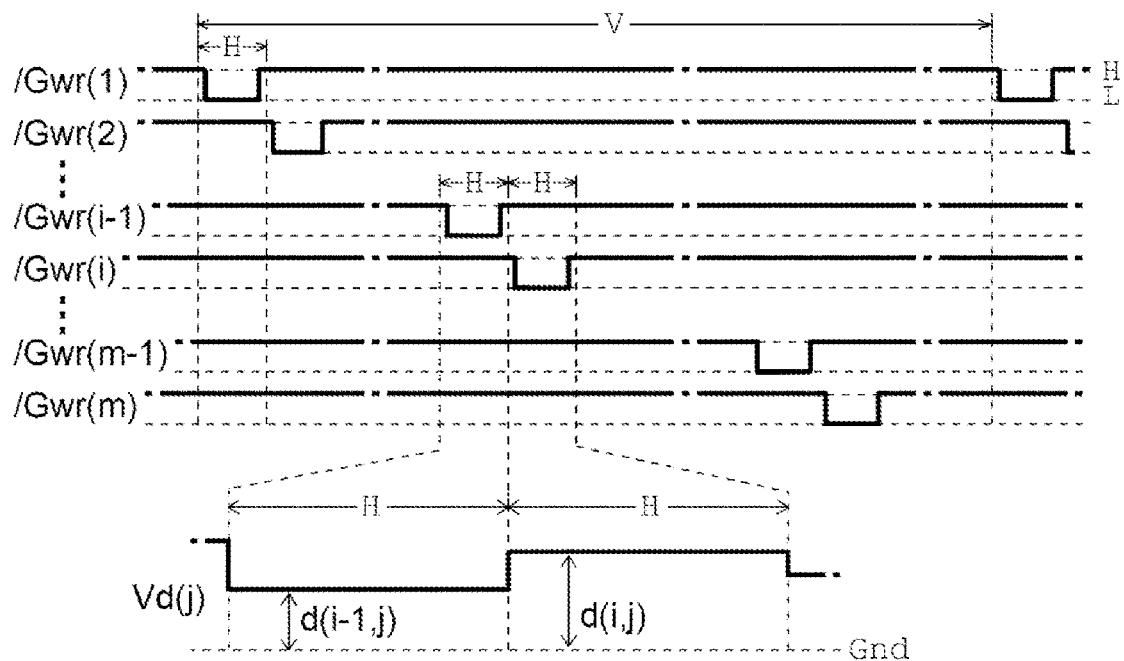
FIG. 4 is a timing chart illustrating an operation of the electro-optical device.

FIG. 4 is a timing chart for describing an operation of the electro-optical device 10.

In the electro-optical device 10, the scanning lines 12 of m rows are scanned one by one in the order of first, second, third, . . . , m-th rows during a period of a frame (V). Specifically, as illustrated in the drawing, the scanning signals /Gwr(1), /Gwr(2), /Gwr(m-1), and /Gwr (m) successively and exclusively reach an L level for each horizontal scanning period (H) by the scanning line drive circuit 120.

In the present embodiment, a period during which the adjacent scanning signals among the scanning signals /Gwr (1) to /Gwr(m) reach the L level is temporally isolated. Specifically, after the scanning signal /Gwr(i-1) changes from the L level to a H level, the next scanning signal /Gwr(i) reaches the L level after a period of time. This period corresponds to a horizontal return period.

In the present description, the period of one frame (V) refers to a period required to display one frame of an image designated by the video data Vid. In a case in which a length of the period of one frame (V) is the same as a vertical synchronization period, for example, when a frequency of a vertical synchronization signal included in the synchronization signal Sync is 60 Hz, it is 16.7 milliseconds which corresponds to one cycle of the vertical synchronization signal. In addition, the horizontal scanning period (H) is an interval of time in which the scanning signals/Gwr(1) to /Gwr(m) reach the L level in order, but in the drawing, for convenience, a start timing of the horizontal scanning period (H) is approximately a center of the horizontal return period.

When a certain scanning signal among the scanning signals/Gwr(1) to /Gwr(m), for example, the scanning signal/Gwr(i) supplied to the scanning line 12 in the i-th row reaches the L level, the transistor 122 in the pixel portion 110 of the i-th row and the j-th column, speaking of the j-th column, is in an ON state. Thus, the gate node g of the transistor 121 in the pixel portion 110 is electrically coupled to the data line 14 of the j-th column.

In the present description, the "On state" of the transistor means that a distance between the source node and the drain node in the transistor is electrically closed to be in a low impedance state. Also, an "OFF state" of the transistor means that the distance between the source node and the drain node electrically opens to be in a high impedance state.

Also, in the description, "electrically coupled" or simply "coupled" means a state in which two or more elements are directly or indirectly coupled. "Electrically non-coupled" or simply "non-coupled" means a state in which the two or more elements are not directly or indirectly coupled.

In the horizontal scanning period (H) in which the scanning signal/Gwr(i) reaches the L level, the data signal output circuit 50 converts the gradation levels of pixels in the i-th row and first column to the i-th row and n-th column indicated by the video data Vdata into analog potentials Vd(1) to Vd(n), and outputs the analog potentials Vd(1) to Vd(n) to the data signals 14 in the first to n-th columns as data signals. In the j-th column, the data signal output circuit 50 converts the gradation level d (i, j) of the pixel in the i-th row and j-th column into the potential Vd(j) of the analog signal, and outputs the potential Vd(j) to the data line 14 in the j-th column.

In the horizontal scanning period (H) in which the scanning signal/Gwr(i-1) one line before the scanning signal/Gwr(i) reaches the L level, the data signal output circuit 50 converts the gradation level d(i-1, j) of the pixel in the (i-1)-th row and j-th column to the potential Vd(j) of the analog signal, and outputs the potential Vd(j) to the data signal 14 in the j-th column as a data signal.

The data signal of the potential Vd (j) is applied to the gate node g of the transistor 121 in the pixel portion 110 in the i-th row and j-th column via the data line 14 in the j-th column, and the potential Vd (j) is retained by the capacitive element 140. Therefore, the transistor 121 causes a current corresponding to a voltage between the gate node and the source node to flow to the OLED 130.

Even when the scanning signal Gwr(i) reaches a H level and the transistor 122 is in the OFF state, the potential Vd(j) is retained by the capacitive element 140, and thus the current continues to flow in the OLED 130. Thus, in the pixel portion 110 in the i-th row and j-th column, the OLED 130 continues to emit light with a voltage retained by the capacitive element 140, that is, a luminance corresponding to the gradation level until the period of one frame (V) elapses and the transistor 122 is turned on again and the voltage of the data signal is applied again.

Although the pixel portion 110 of the i-th row and j-th column has been described here, the OLED 130 of the pixel portion 110 other than the j-th column in the i-th row also emits light at the luminance indicated by the video data Vdata.

Also, the OLED 130 of the pixel portion 110 other than the i-th row also emits light with the luminance indicated by the video data Vdata by the scanning signals/Gwr(1) to /Gwr(m) reaching the L level in order.

Thus, in the electro-optical device 10, during the period of one frame (V), the OLED 130 in all of the pixel portions 110 from the first row and first column to the m-th row and n-th column emits light at the luminance indicated by the video data Vdata, and an image of one frame is displayed.

Figure 6:
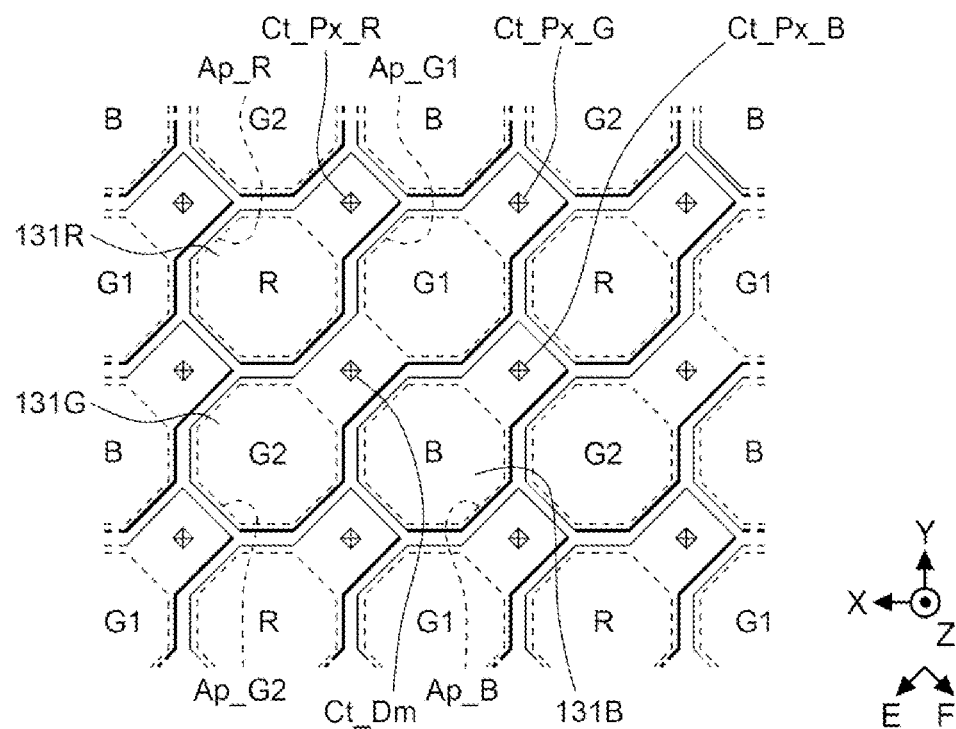
FIG. 6 is a plan view illustrating a pixel electrode in the electro-optical device.
Figure 7:
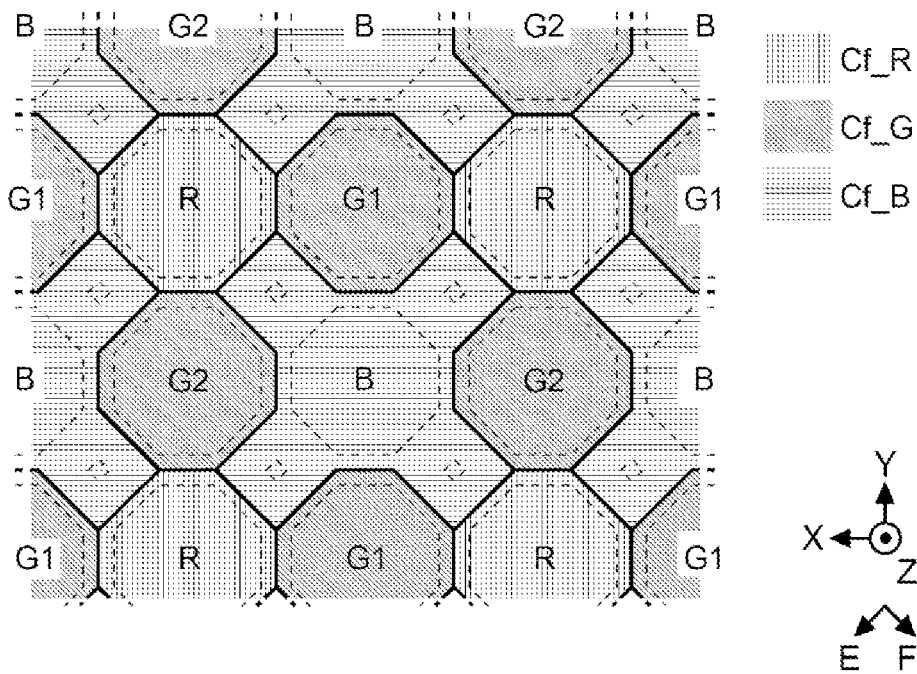
FIG. 7 is a plan view illustrating an arrangement of a coloring layer in the electro-optical device.

FIG. 5 is a plan view illustrating an arrangement of the pixel portions 110 in the display region 100 in the electro-optical device, and FIG. 6 is a plan view illustrating a shape of the pixel electrode. FIG. 7 is a plan view illustrating an arrangement of a coloring layer. Further, in FIGS. 5, 6, and 7, an E direction is a direction in which the X direction is rotated counterclockwise by 45 degrees, and an F direction is a direction in which the E direction is rotated counterclockwise by 90 degrees.

A color of one dot in the display region 100 is represented by an additive color mixture of emitted light from four light-emitting regions surrounded by a frame Dp in FIG. 5.

Specifically, in the frame Dp, light-emitting regions R, G1, G2, and B are arranged in two rows and two columns, among the light-emitting regions R, G1, G2, and B, the light-emitting regions R and B are arranged diagonally on one side in the two rows and two columns, and the light-emitting regions G1 and G2 are arranged diagonally on the other side.

The light-emitting region R is a region in the pixel electrode 131R illustrated in FIG. 6 which is in contact with the light-emitting layer 132. The light-emitting regions G1 and G2 are regions in the pixel electrode 131G which are in contact with the light-emitting layer 132. The light-emitting region B is a region in the pixel electrode 131B which is in contact with the light-emitting layer 132.

The light-emitting regions R, G1, G2, and B are defined by opening portions Ap_R, Ap_G1, Ap_G2, and Ap_B in order. The opening portions Ap_R, Ap_G1, Ap_G2, and Ap_B are formed by patterning a pixel separation layer provided to cover the pixel electrodes 131R, 131G, and 131B as described below.

The reason that the green light-emitting region becomes the two regions of G1 and G2 and is wider than one of the light-emitting region R and the light-emitting region B is that green has the highest visibility among red, green, and blue, and thus the life of green is ensured.

In FIG. 6, the pixel electrode 131R has a shape in which an octagon and a rectangle are added in plan view. Specifically, one side of a rectangular region and one side of an octagonal region in the pixel electrode 131R have substantially the same length, and the rectangle is located in a direction opposite to the E direction with respect to the octagon. In such pixel electrode 131R, an octagonal opening portion Ap_R smaller than the octagon is provided in the octagonal region, and a contact region Ct_Px_R is provided in the rectangular region. The contact region Ct_Px_R is a coupling region of a lower wiring line in the pixel electrode 131R, and the lower wiring line is electrically coupled to the drain node d of the transistor 121 in the pixel portion 110R via a plurality of elements.

In plan view, the pixel electrode 131G has a shape in which two pixel electrodes 131R are continuous in the E direction. In the pixel electrode 131G, an octagonal opening portion Ap_G1 smaller than the octagon is provided in the octagonal region in the direction opposite to the E direction among the two octagons. In the pixel electrode 131G, an octagonal opening portion Ap_G2 smaller than the octagon is provided in the octagonal region in the E direction among the two octagons.

Further, in the pixel electrode 131G, a contact region Ct_Px_G is provided in the rectangular region in the direction opposite to the direction E with respect to the opening portion A_G1, and a dummy contact region Ct_Dm is provided in the rectangular region between the opening portions Ap_G1 and Ap_Px G2.

The contact region Ct_Px_G is a coupling region of a lower wiring line in the pixel electrode 131G, and the lower wiring line is electrically coupled to the drain node d of the transistor 121 in the pixel portion 110G via a plurality of elements. The dummy contact region Ct_Dm is a region that is not coupled to the lower wiring line in the pixel electrode 131G.

The pixel electrode 131B has substantially the same shape as the pixel electrode 131R in plan view. In the pixel electrode 131B, an octagonal opening portion Ap_B smaller than the octagon is provided in the octagonal region, and a contact region Ct_Px_B is provided in the rectangular region. The contact region Ct_Px_B is a coupling region of the lower wiring line in the pixel electrode 131B, and the lower wiring line is electrically coupled to the drain node d of the transistor 121 in the pixel portion 110B via a plurality of elements.

FIG. 7 is a plan view illustrating an arrangement of a coloring layer. As illustrated in the drawing, a red coloring layer Cf_R is provided to cover the light-emitting region R in plan view, and a green coloring layer Cf_G is provided to cover the light-emitting regions G1 and G2. A blue coloring layer Cf_B is provided to cover the light-emitting region B and is provided corresponding to a region between the light-emitting regions G1 and G2 adjacent to each other in the E direction and the F direction.

Figure 8:
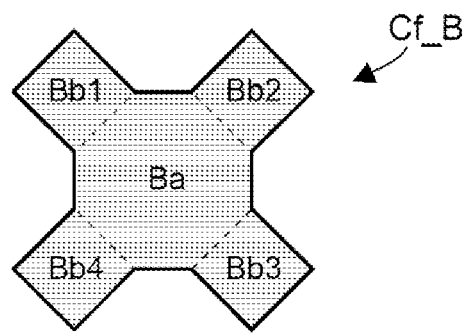
FIG. 8 is a plan view illustrating a region of the coloring layer.

FIG. 8 is a diagram for describing a region of the coloring layer Cf_B provided corresponding to one light-emitting region B.

As illustrated in the drawing, the coloring layer Cf_B includes an octagonal region Ba that covers the light-emitting region B and rectangular regions Bb1, Bb2, Bb3, and Bb4 in a region between the light-emitting regions G1 and G2 in plan view.

Among the four regions Bb1, Bb2, Bb3, and Bb4, in plan view, the region Bb1 has a rectangular shape that is in contact with the octagonal region Ba in a direction opposite to the F direction, and is provided between the coloring layer Cf_G (corresponding to the light-emitting region G2) adjacent to the region Ba in the X direction and the coloring layer Cf_G corresponding to (the light-emitting region G1) adjacent to the region Ba in the Y direction.

In plan view, the region Bb2 has a rectangular shape that is in contact with the region Ba in the direction opposite to the E direction, and is provided between the coloring layer Cf_G (corresponding to the light-emitting region G1) adjacent to the region Ba in the Y direction and the coloring layer Cf_G corresponding to (the light-emitting region G2) adjacent to the region Ba in a direction opposite to the X direction.

The light-emitting region G2 adjacent to the region Ba in the direction opposite to the X direction is the light-emitting region G2 denoted by Fi in parentheses in FIG. 5 and is different from the light-emitting region G2 of one dot represented by the frame Dp including the region Ba.

In plan view, the region Bb3 has a rectangular shape that is in contact with the region Ba in the F direction, and is provided between the coloring layer Cf_G (corresponding to the light-emitting region G2) adjacent to the region Ba in the direction opposite to the X direction and the coloring layer Cf_G corresponding to (the light-emitting region G1) adjacent to the region Ba in a direction opposite to the Y direction.

The light-emitting region G1 adjacent to the region Ba in the direction opposite to the Y direction is the light-emitting region G1 denoted by Sx in parentheses in FIG. 5 and is different from the light-emitting region G1 of one dot represented by the frame Dp including the region Ba.

In plan view, the region Bb4 has a rectangular shape that is in contact with the region Ba in the E direction, and is provided between the coloring layer Cf_G (corresponding to the light-emitting region G1) adjacent to the region Ba in the direction opposite to the Y direction and the coloring layer Cf_G corresponding to (the light-emitting region G2) adjacent to the region Ba in the X direction.

Next, a cross-sectional structure of a main portion of the electro-optical device 10 will be described.

Figure 9:
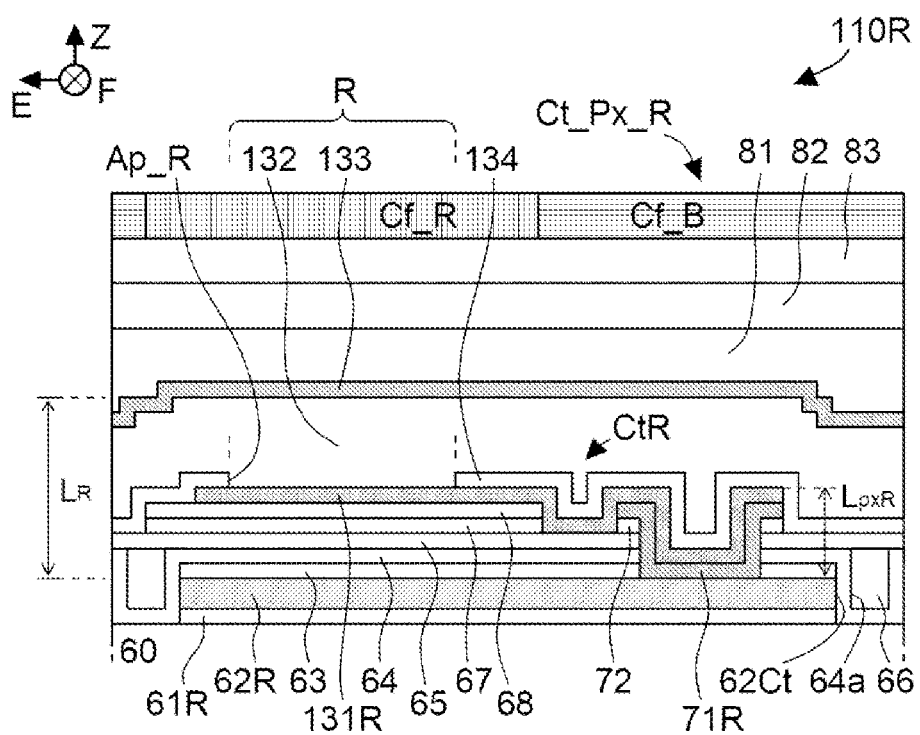
FIG. 9 is a cross-sectional view of a main portion of the pixel portion.

FIG. 9 is a cross-sectional view of a main portion of the pixel portion 110R in the electro-optical device 10 and is a cross-sectional view when a region including the light-emitting region R and the contact region Ct_Px_R is cut in the E direction in FIG. 6.

A contact electrode 61R is formed at a substrate 60 and is electrically coupled to a circuit layer which is not illustrated via a contact hole which is not illustrated. The circuit layer includes the scanning lines 12, the data lines 14, and the transistors 121 and 122.

A reflective electrode 62R is stacked on the contact electrode 61R to reflect light incident in a direction opposite to the Z direction. As the reflective electrode 62R, for example, a conductive layer in which an alloy (AlCu) film of aluminum and copper is layered on a titanium (Ti) film is used. The contact electrode 61R and the reflective electrode 62R are provided corresponding to the pixel portion 110R among those in which the conductive layer is individually patterned in an island shape in plan view for each of the pixel portions 110R, 110G, and 110B.

A gap 62Ct is generated due to the formation of the island shape.

A reflection enhancing layer 63 is a layer for enhancing reflection characteristics by the reflective electrode 62R. The reflection enhancing layer 63 has insulating properties and light transmissive properties and is provided to cover the reflective electrode 62R. For example, silicon oxide is used as the reflection enhancing layer 63.

A first insulating layer 64 covers the reflection enhancing layer 63 and is provided along the gap 62Ct. Thus, the first insulating layer 64 has a recessed portion 64a in the vicinity of the gap 62Ct. An embedded insulating layer 66 is provided to fill the recessed portion 64a. A second insulating layer 65 is stacked on the first insulating layer 64 and the embedded insulating layer 66. Silicon nitride (SiN) is used as the first insulating layer 64 and the second insulating layer 65, for example, and silicon oxide is used as the embedded insulating layer 66, for example.

A protective layer 72 is an insulating film stacked on the second insulating layer 65, and, for example, silicon oxide is used.

The reflection enhancing layer 63, the first insulating layer 64, the second insulating layer 65, and the protective layer 72 are open in the contact region Ct_Px_R.

The relay electrode 71R is formed along this opening, and patterning the conductive layer laminated on the reflective electrode 62R and the protective layer 72. The relay electrode 71R has a recess along this opening. For example, titanium nitride (TiN) is used as the conductive layer constituting the relay electrode 71R.

A first optical adjustment layer 67 and a second optical adjustment layer 68 are insulating layers for adjusting an optical distance in an optical resonator and have light transmissive properties For example, silicon oxide is used as the first optical adjustment layer 67 and the second optical adjustment layer 68. The first optical adjustment layer 67 and the second optical adjustment layer 68 are open in a region CtR of the contact region Ct_Px_R.

The pixel electrode 131R is formed by patterning a conductive layer having light transmissive properties. The pixel electrode 131R is stacked on the second optical adjustment layer 68 or the relay electrode 71R, and the second insulating layer 65 is stacked in the region CtR in which the first optical adjustment layer 67 and the second optical adjustment layer 68 are open. The pixel electrode 131R is patterned in a shape illustrated in FIG. 6 in plan view. The pixel electrode 131R is stacked along the opening in the region CR, and thus the pixel electrode 131R has a recessed portion corresponding to the region CtR. For example, indium Tin Oxide (ITO) is used as the conductive layer constituting the pixel electrode 131R.

A pixel separation layer 134 is stacked on the second optical adjustment layer 68, the second insulating layer 65, or the pixel electrode 131R, and is an insulating film provided to cover a peripheral edge portion of the pixel electrode 131R. In the pixel portion 110R, the pixel separation layer 134 has an opening Ap_R in the shape illustrated in FIG. 5 in plan view. For example, silicon oxide is used as the pixel separation layer 134.

The light-emitting layer 132 is stacked on the pixel electrode 131R or the pixel separation layer 134. The light-emitting layer 132 is not particularly illustrated, includes a hole injection layer, an organic light-emitting layer, and an electron transport layer and is common in all the pixel portions including the pixel portions 110R, 110G, and 110B.

The common electrode 133 is a conductive layer having light transmissive properties and reflectivity. The common electrode 133 is provided to cover the light-emitting layer 132 and is common in all the pixel portions including the pixel portions 110R, 110G, and 110B. For example, an alloy of Mg and Ag is used as the common electrode 133.

The light-emitting layer 132 is a region on the pixel electrode 131R that is not covered by the pixel separation layer 134, that is, a region that is in contact with the pixel electrode 131R, and holes are supplied from a region defined by the opening Ap_R to emit white light.

In a portion corresponding to the light-emitting region R in plan view, an optical resonator is formed by the reflective electrode 62R and the common electrode 133 in cross-sectional view, and an optical distance LR between the reflective electrode 62R and the common electrode 133 is adjusted by a film thickness of the first optical adjustment layer 67 and the second optical adjustment layer 68. Strictly speaking, the optical distance is a value obtained by multiplying a distance between the reflective electrode 62R and the common electrode 133 by a refractive index of a medium between the reflective electrode 62R and the common electrode 133, but here, it is simply illustrated as a physical distance.

In a portion corresponding to the light-emitting region R, the white light emitted from the light-emitting layer 132 is repeatedly reflected between the reflective electrode 62R and the common electrode 133, and the intensity of light having a wavelength corresponding to the optical distance LR is enhanced. In the present embodiment, as an example, the intensity of light having a wavelength of 610 nm is enhanced in the pixel portion 110R. The enhanced light passes through the common electrode 133 and is emitted as red light in the Z direction and the like through the coloring layer Cf_R.

In this way, light including a wavelength range of red from the light-emitting region R is emitted in the Z-direction or the like.

A first sealing layer 81 is an insulating layer having light transmissive properties and is provided to cover the common electrode 133.

A planarized layer 82 is an insulating layer having light transmissive properties, and is provided to cover the first sealing layer 81 so that an observation surface is flat without a step. For example, an organic material such as an epoxy resin is used as the planarized layer 82.

A second sealing layer 83 is an insulating layer having light transmissive properties, and is provided to cover the planarized layer 82. The first sealing layer 81 and the second sealing layer 83 are provided to prevent moisture and oxygen from entering the light-emitting layer 132. For example, silicon oxynitride (SiON) is used as the first sealing layer 81 and the second sealing layer 83.

In the light-emitting region R of the pixel portion 110R, the coloring layer Cf_R is provided as described in FIG. 7 to cover the second sealing layer 83 in plan view. The coloring layer Cf_R is provided by patterning a photosensitive resin including a pigment that selectively transmits red color light using a photolithography technique. Thus, the coloring layer Cf_R has a function of transmitting red color light. The red color light is light including the wavelength range of red. In the present embodiment, the wavelength range of red is 580 nm or more and 700 nm or less.

In the pixel portion 110R, the contact region Ct_Px_R is included in the region Bb4 in plan view, and thus the blue coloring layer Cf_B is provided. Furthermore, a filling layer, a protective glass, and the like are provided on the coloring layers Cf_R and Cf_B, but they are omitted because they are not important in this case.

Figure 10:
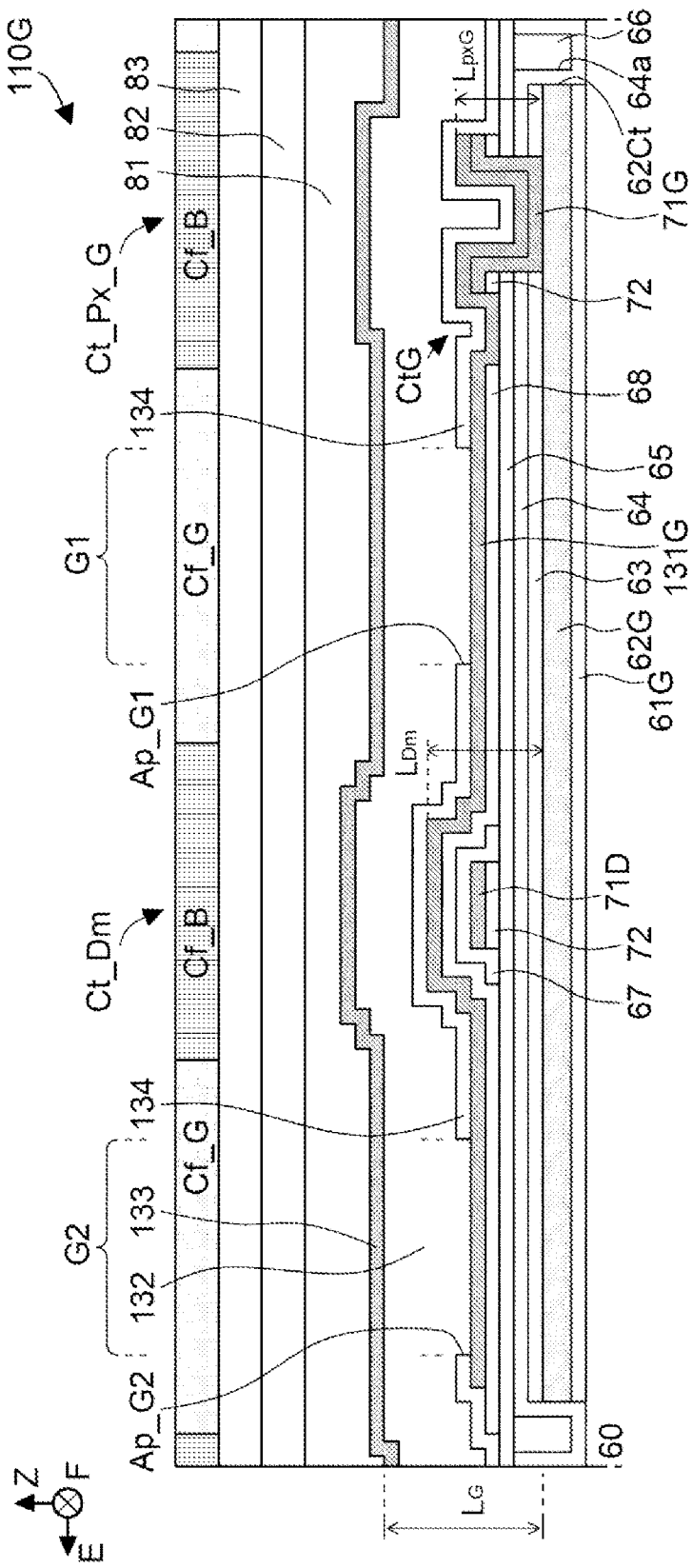
FIG. 10 is a cross-sectional view of a main portion of the pixel portion.

FIG. 10 is a cross-sectional view of a main portion of the pixel portion 110G of the electro-optical device 10 and is a cross-sectional view when the region including the light-emitting region G2, the dummy contact region Ct_Dm, the light-emitting region G1 and the contact region Ct_Px_G is cut in the E direction in FIG. 6.

First, the light-emitting regions G1 and G2 in the pixel portion 110G will be described. The light-emitting regions G1 and G2 are different from the light-emitting region R illustrated in FIG. 9 in that, first, the first optical adjustment layer 67 is not provided in the light-emitting regions G1 and G2.

Specifically, in a portion corresponding to the light-emitting region R, the first optical adjustment layer 67 and the second optical adjustment layer 68 are provided between the reflective electrode 62R and the pixel electrode 131R, whereas, in a portion corresponding to the light-emitting regions G1 and G2, the second optical adjustment layer 68 is provided between the reflective electrode 62G and the pixel electrode 131G but the first optical adjustment layer 67 is not provided.

Thus, in the portion corresponding to the light-emitting regions G1 and G2, an optical distance LG between a reflective electrode 62G and the common electrode 133 is shorter than an optical distance LR at a portion corresponding to the light-emitting region R by the first optical adjustment layer 67 not present.

In addition, the light-emitting regions G1 and G2 are different from the light-emitting region R in that the pixel electrode 131G is patterned in the shape illustrated in FIG. 6 in plan view. A point in which the pixel electrode 131G is stacked on the second optical adjustment layer 68 in the light-emitting regions G1 and G2 is common to the light-emitting region R.

The contact electrode 61R, the reflective electrode 62R, and the relay electrode 71R in the pixel portion 11OR are provided in order as a contact electrode 61G, a reflective electrode 62G, and a relay electrode 71G in the pixel portion 110G.

In the portion corresponding to the light-emitting regions G1 and G2, the white light emitted from the light-emitting layer 132 is repeatedly reflected between the reflective electrode 62G and the common electrode 133, and the intensity of light having a wavelength corresponding to the optical distance LG is enhanced. In the present embodiment, as an example, the intensity of light having a wavelength of 540 nm is enhanced in the pixel portion 110G. The enhanced light passes through the common electrode 133 and is emitted as green light in the Z direction and the like through the coloring layer Cf_G.

In this way, light including a wavelength range of green is emitted in the Z-direction and the like from the light-emitting regions G1 and G2 in plan view.

Next, the contact region Ct_Px_G in the pixel portion 110G will be described.

In the contact region Ct_Px_G, the reflection enhancing layer 63, the first insulating layer 64, the second insulating layer 65, and the protective layer 72 are open, and the relay electrode 71G is provided along the opening and is stacked on the reflective electrode 62G and the protective layer 72. Since the first optical adjustment layer 67 is not provided in the pixel portion 110G, only the second optical adjustment layer 68 is open in the region CtG.

Due to the contact region Ct_Px_G, the pixel electrode 131G is electrically coupled to a circuit layer, which is not illustrated, via the relay electrode 71G, the reflective electrode 62G, and the contact electrode 61G.

In the dummy contact region Ct_Dm, the protective layer 72 and a dummy relay electrode 71D are provided in order on a surface of the second insulating layer 65 in the Z direction. The dummy relay electrode 71D is formed by patterning the same layers as the relay electrodes 71R, 71G, and 71B.

In the dummy contact region Ct_Dm, the first optical adjustment layer 67 is provided to cover the protective layer 72 and the dummy relay electrode 71D.

Additionally, in the dummy contact region Ct_Dm, the first optical adjustment layer 67 and the second optical adjustment layer 68 are present between the pixel electrode 131G and the dummy relay electrode 71D, and the protective layer 72, the second insulating layer 65 and the like are present between the dummy relay electrode 71D and the reflective electrode 62G.

Therefore, the pixel electrode 131G and the dummy relay electrode 71D are electrically non-coupled to each other and are also electrically non-coupled to the dummy relay electrode 71D and the reflective electrode 62G.

In the present embodiment, in the dummy contact region Ct_Dm, the pixel electrode 131G is electrically non-coupled to the reflective electrode 62G (the drain node d of the transistor 121). Therefore, in the dummy contact region Ct_Dm, the pixel electrode 131G does not contribute to any electrical coupling of the reflective electrode 62G. It is referred to as a dummy contact region in that sense.

In the light-emitting regions G1 and G2 of the pixel portion 110G, the coloring layer Cf_G is provided as described in FIG. 7 to cover the second sealing layer 83 in plan view. The coloring layer Cf_G is provided by patterning a photosensitive resin including a pigment that selectively transmits green color light using a photolithography technique. Thus, the coloring layer Cf_G has a function of transmitting green color light. The green colored light is light including a wavelength range of green. In the present embodiment, the wavelength range of green is 500 nm or more and 580 nm or less.

In the pixel portion 110G, since the contact region Ct_Px_G is included in the region Bb3 in plan view, the blue coloring layer Cf_B is provided, and since the dummy contact region Ct_Dm is included in the region Bb1 in plan view, the blue coloring layer Cf_B is provided.

Figure 11:
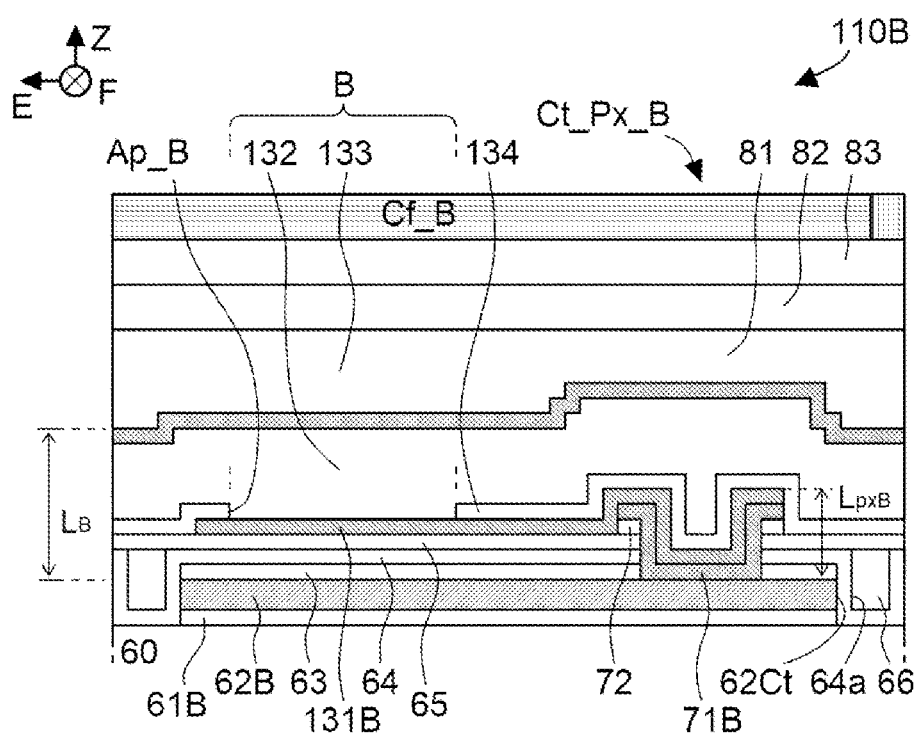
FIG. 11 is a cross-sectional view of a main portion of the pixel portion.

FIG. 11 is a cross-sectional view of a main portion of a pixel portion 110B of the electro-optical device 10, and is a cross-sectional view when a region including the light-emitting region B and the contact region Ct_Px_B in FIG. 6 is cut in the E direction.

First, the light-emitting region B in the pixel portion 110G will be described. The light-emitting region B is different from the light-emitting region G1 or G2 illustrated in FIG. 10 in that, first, the second optical adjustment layer 68 is not provided in the light-emitting region B.

Thus, in a portion corresponding to the light-emitting region B, an optical distance LB between a reflective electrode 62B and the common electrode 133 is shorter than the optical distance LG at the portion corresponding to the light-emitting region G1 or G2 by the second optical adjustment layer 68 not present.

Thus, the optical distances LR, LG, and LB in the optical resonator is LR>LG>LB.

In the pixel portion 110B, a pixel electrode 131B is patterned in the shape illustrated in FIG. 6 in plan view. A point in which the pixel electrode 131B is stacked on the second optical adjustment layer 68 in the light-emitting region B is common to the light-emitting regions R, G1, and G2.

The contact electrode 61R, the reflective electrode 62R, and the relay electrode 71R in the pixel portion 11OR are provided in order as a contact electrode 61B, a reflective electrode 62B, and a relay electrode 71B in the pixel portion 110B.

In the contact region Ct_Px_B, the reflection enhancing layer 63, the first insulating layer 64, the second insulating layer 65, and the protective layer 72 are open, and the relay electrode 71B is provided along the opening and is stacked on the reflective electrode 62B and the protective layer 72. In the pixel portion 110B, the first optical adjustment layer 67 and the second optical adjustment layer 68 are not provided, and thus the recessed portions such as the regions CtR and Ct_G are not provided. Due to the contact region Ct_Px_B, the pixel electrode 131B is electrically coupled to a circuit layer, which is not illustrated, via the relay electrode 71B, the reflective electrode 62B, and the contact electrode 61B in order.

In the light-emitting region B of the pixel portion 110B, the coloring layer Cf_B is provided to cover the second sealing layer 83. The coloring layer Cf_B is provided by patterning a photosensitive resin including a pigment that transmits blue light using a photolithography technique. Thus, the coloring layer Cf_B has a function of transmitting blue color light. Blue color light is light including a wavelength range of blue. In the present embodiment, the wavelength range of blue is 400 nm or more and 500 nm or less.

Since the contact region Ct_Px_B in the pixel portion 110B is included in the region Bb3 in plan view, the blue coloring layer Cf_B is provided, and since the dummy contact region Ct_Dm is included in the region Bb2 in plan view, the blue coloring layer Cf_B is provided.

In a portion corresponding to the light-emitting region B, the white light emitted from the light-emitting layer 132 is repeatedly reflected between the reflective electrode 62B and the common electrode 133, and the intensity of light having a wavelength corresponding to the optical distance LB is enhanced. In the present embodiment, as an example, the intensity of light having a wavelength of 470 nm is enhanced in the pixel portion 110B. The enhanced light passes through the common electrode 133 and is emitted as blue light in the Z direction and the like through the coloring layer Cf_B.

In this way, light including a wavelength range of blue is emitted from the light-emitting region B in the Z direction and the like in plan view.

Figure 12:
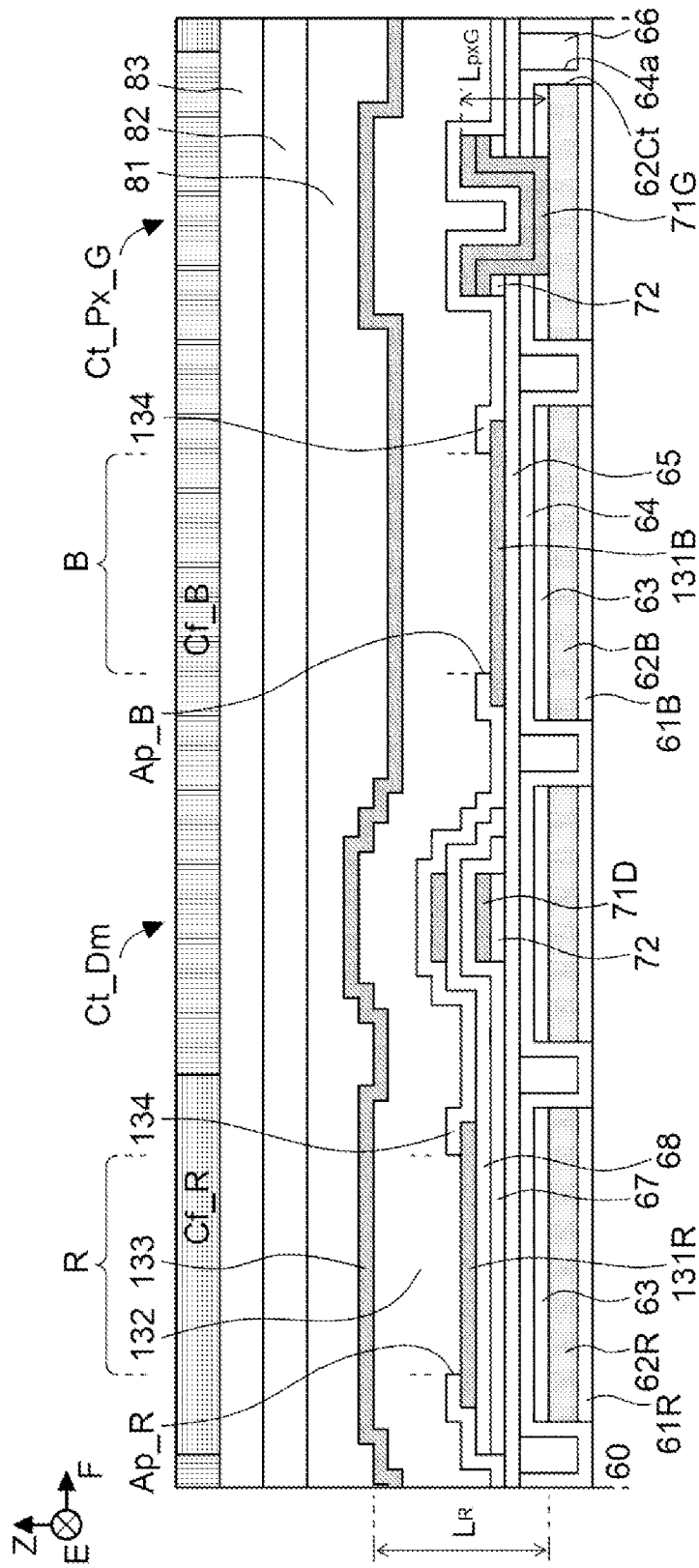
FIG. 12 is a cross-sectional view of a main portion of the pixel portion.

FIG. 12 is a cross-sectional view of a main portion of the electro-optical device 10, and is a cross-sectional view when a region including the light-emitting region R, the dummy contact region Ct_Dm, the light-emitting region B, and the contact region Ct_Px_G in FIG. 6 is cut in the F direction.

The light-emitting region R, the dummy contact region Ct_Dm, and the light-emitting region B and the contact region Ct_Px_G are as described above. Further, as described above, the coloring layer Cf_B is provided in the region Bb3 in which the contact region Ct_Px_G is provided and the region Bb1 in which the dummy contact region Ct_Dm is provided.

In the contact regions Ct_Px_R, Ct_Px_G1, and Ct_Px_B, the reflection enhancing layer 63, the first insulating layer 64, the second insulating layer 65, the protective layer 72, and the relay electrode 71 (71R, 71G) are provided in order from the reflective electrode 62 (62R, 62G, 62B) to the pixel electrode 131. Therefore, in the contact regions Ct_Px_R, Ct_Px_G1, and Ct_Px_B, a distance Lpx from the reflective electrode 62 to the pixel electrode 131 is constant in the pixel portions 110R, 110G, and 110B.

On the other hand, in the dummy contact region Ct_Dm, the reflection enhancing layer 63, the first insulating layer 64, the second insulating layer 65, the protective layer 72, the dummy relay electrode 71D, the first optical adjustment layer 67, and the second optical adjustment layer 68 are provided in order from the reflective electrode 62G to the pixel electrode 131G.

In other words, in the contact regions Ct_Px_R, Ct_Px_G, and Ct_Px_B, the first optical adjustment layer 67 and the second optical adjustment layer 68 are not provided, compared to the dummy contact region Ct_Dm. Thus, in the dummy contact region Ct_Dm, a distance LDm from the reflective electrode 62G to the pixel electrode 131G is longer than the distance Lpx in the contact regions Ct_Px_R, Ct_Px_G1, and Ct_Px_B. That is, in the pixel portions 110R, 110G, and 110B, when the reflective electrode 62 is used as a reference, a distance to the pixel electrode 131 in the Z direction is the longest (thickest) in the dummy contact region Ct_Dm.

The first sealing layer 81 is provided to cover the common electrode 133. The planarized layer 82 provided to cover the first sealing layer 81 is formed, for example, by screen printing. Screen printing is printing using "screen mesh" that is made by folding synthetic fibers or metal fibers, and an organic material such as an epoxy resin is caused to pass through a net of the screen mesh by moving a squeegee and is printed to cover the first sealing layer 81. In the screen printing, intersection points of the net are pressed against the first sealing layer 81 with the movement of the squeegee. In the pressing, a force may not be evenly applied in the display region 100, and some regions may be more pressed than other regions. In addition, in a manufacturing process of the electro-optical device 10, there are many cases in which some regions are pressed by applying a force in the display region 100 without being limited to the screen printing.

In the pressed region, the light-emitting layer 132 is locally thinned. In a portion in which the light-emitting layer 132 is locally thinned, a resistance value becomes low, and a minute current easily flows. When the micro-current flows, it tends to emit red light with high efficiency. The red light is light in a wavelength range resonated by an optical resonator having an optical distance of LR which has the highest light-emitting efficiency.

In order to prevent this phenomenon, it can be dealt with by thickening the planarized layer 82, but there is a problem that a distance from the light-emitting layer 132 to the coloring layers Cf_R, Cf_G, and Cf_B increases, and thus a viewing angle becomes narrower.

In the present embodiment, when a part of the display region 100 is pressed, the pressing is suppressed by the dummy contact region Ct_Dm as a stopper, and thus local thinning of the light-emitting layer 132 is suppressed in the light-emitting regions R, G1, G2, and B.

Further, the light-emitting layer 132 becomes thinner around the dummy contact region Ct_Dm due to the pressing. In a portion in which the light-emitting layer 132 is locally thinned, there is a tendency to emit light in a red color as described below. The dummy contact region Ct_Dm is included in the coloring layer Cf_B in plan view. Thus, even when the light-emitting layer 132 emits light in a red color due to the thinning of the light-emitting layer 132 in the vicinity of the dummy contact region Ct_Dm, the light is shielded by the coloring layer Cf_B, and thus the red light is not visually recognized by the observer.

Accordingly, according to the present embodiment, it is possible to suppress a reduction in display quality due to the local pressing against the display region 100.

Figure 25:
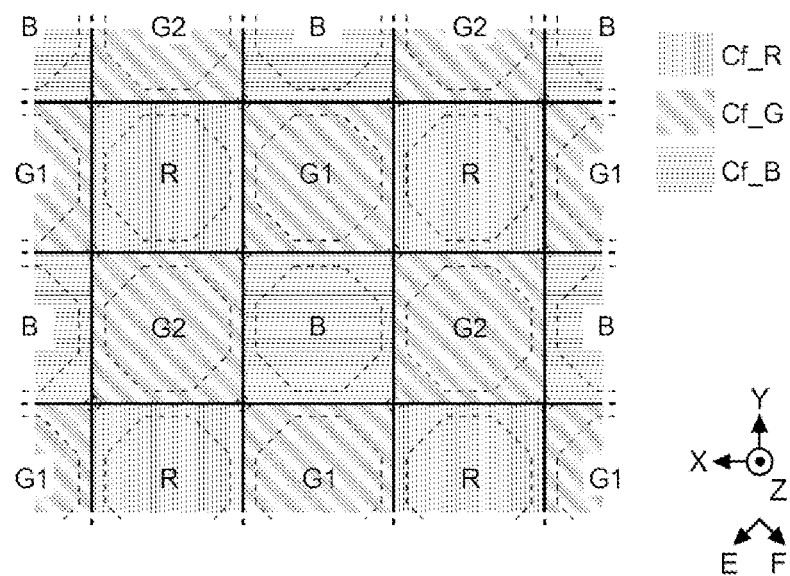
FIG. 25 is a plan view illustrating a light-emitting region in the electro-optical device according to the reference example.

In the present embodiment, the light-emitting regions R and B are arranged repeatedly in the X direction and the Y direction, and the light-emitting regions G1 and G2 are repeatedly arranged in the E direction and the F direction, that is, in an oblique direction with respect to the X direction or the Y direction. In the arrangement of the light-emitting regions R, G1, G2, and B, the following problems occur in a configuration of a reference example in which the coloring layer Cf_R, Cf_G, and Cf_B are provided corresponding to regions defined by boundary lines, as illustrated in FIG. 25.

Figure 14:
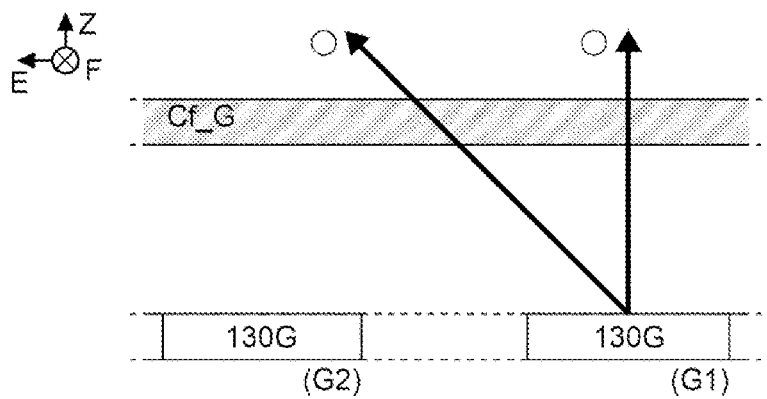
FIG. 14 is a diagram illustrating visual characteristics of an electro-optical device according to a reference example.

In the configuration of the reference example, as illustrated in FIG. 14, the coloring layers Cf_G are contiguously arranged in the E direction, and thus, in the light emitted from the light-emitting region G1 in the OLED 130G, not only a component in the Z direction but also a component in the E direction (oblique light) are not small and is transmitted through the coloring layer Cf_G.

In FIG. 14, the coloring layers Cf_G is continuous in the E direction and is also continuous in the F direction, and thus, in the light emitted from the light-emitting region G1, oblique light in the F direction is not small and is transmitted through the coloring layer Cf_G. Further, in FIG. 14, the emitted light from the light-emitting region G1 is focused, but also in the emitted light from the light-emitting region G2, the oblique light in the E direction and the F direction is not small and is transmitted through the coloring layer Cf_G.

Although not specifically illustrated, in the reference example, since the coloring layers Cf_R and Cf_B are arranged alternately in the E direction, that is, they are arranged not to be continuous in the E direction, the oblique light emitted from one of the OLED 130R or the OLED 130G is shielded by the coloring layer corresponding to the other.

That is, in the reference example, the oblique light is also visually recognized in the emitted light from the OLED 130G, whereas the oblique light is difficult to be visually recognized in the emitted light from the OLEDs 130R and 130B.

Thus, in the reference example, green oblique light is visually recognized, whereas since red and blue oblique light is difficult to be visually recognized, a degree of color change due to a viewing angle in the oblique direction differs between green and red and blue.

Figure 13:
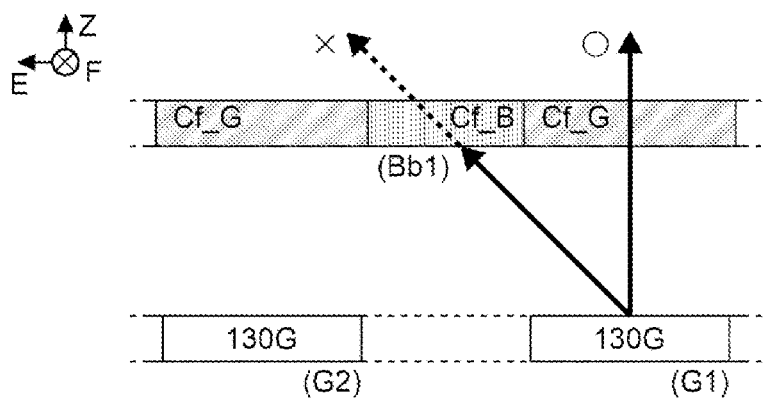
FIG. 13 is a diagram illustrating visual characteristics of the electro-optical device according to the embodiment.

On the other hand, in the present embodiment, the coloring layer Cf_B is provided in, for example, the region Bb1 between the light-emitting regions G1 and G2 in plan view, as illustrated in FIG. 13. Thus, in the light emitted from the OLED 130G, the oblique light in the E direction is shielded by the coloring layer Cf_B. Although the region Bb1 has been described here, the same applies to the regions Bb2, Bb3, and Bb4. That is, in the coloring layer Cf_B, the regions Bb1, Bb2, Bb3, and Bb4 shield green light emitted from the light-emitting region G1 or G2. The coloring layer Cf_G transmits green light emitted from the light-emitting region G1 or G2 in the Z direction.

Thus, in the present embodiment, similar to the red and blue oblique light, the green oblique light is difficult to be visually recognized, and thus the degree of color change due to the viewing angle in the oblique direction is close to that of red, green, and blue.

The technology described in JP-A-2019-117941 has a configuration in which the red light-emitting region is assigned to one of the four octagonal regions which are arranged in two rows and two columns to express a collar of one dot, the green light-emitting region is assigned to another one, and the blue light-emitting region is assigned to the remaining two, and is different from the present embodiment in which the two green light-emitting regions G1 and G2 are assigned diagonally. Thus, in the technology described in JP-A-2019-117941, a configuration in which the two green light-emitting regions G1 and G2 are assigned diagonally is assumed as the reference example illustrated in FIG. 25.

Figure 15:
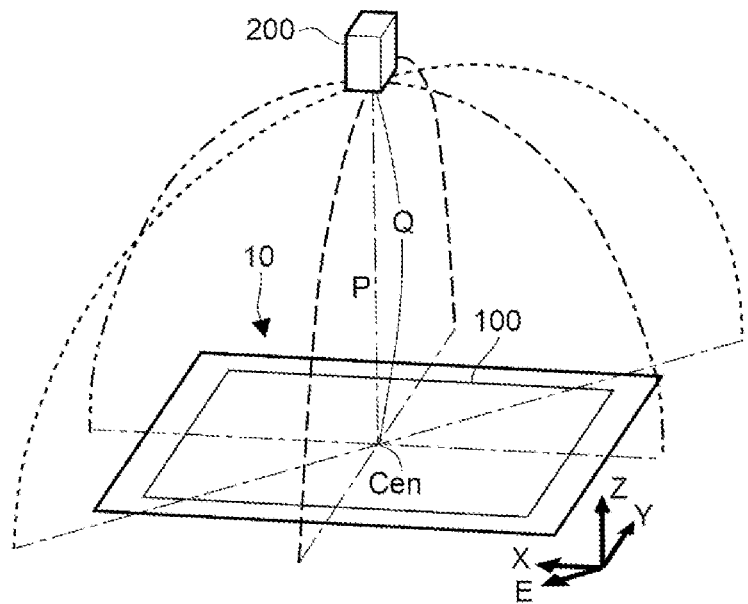
FIG. 15 is an explanatory diagram of viewing angle characteristics.

FIG. 15 is an explanatory diagram illustrating measurement of the color change in the electro-optical device 10 according to the present embodiment. For the color change, chromaticity when a diagonal center Cen of the display region 100 is seen from the front and chromaticity when the diagonal center is shifted by, for example, 20 degrees are measured by a chromaticity meter 200, both the chromaticities are plotted in a u'v' coordinate system, and the color change is expressed by a distance (Δu'v') on a plotted color space. The distance (Δu'v') on the color space is referred to as a color difference, and when the color difference is greater than 0.02, it is said that humans can perceive the color difference.

In the present description, the case in which the diagonal center Cen is seen from the front is a case in which the diagonal center Cen of the display region 100 is seen at a point separated from the diagonal center Cen by a distance Q in a vertical straight line P passing through the diagonal center Cen of the display region 100.

Further, when the diagonal center is shifted by 20 degrees, there are the following three ways.

That is, there are, firstly, a case in which the diagonal center Cen of the display region 100 is seen at a point separated by the distance Q from the diagonal center Cen in a straight line formed by tilting the vertical straight line P by 20 degrees from the diagonal center Cen on a plane defined by the Y and Z directions (Y-Z: longitudinal direction), secondly, a case in which the diagonal center Cen of the display region 100 is seen at a point separated by the distance Q from the diagonal center Cen in a straight line formed by tilting the vertical straight line P by 20 degrees from the diagonal center Cen on a plane defined by the X and Z directions (X-Z: transverse direction), and thirdly, a case in which the diagonal center Cen of the display region 100 is seen at a point separated by the distance Q from the diagonal center Cen in a straight line formed by tilting the vertical straight line P by 20 degrees from the diagonal center Cen on a plane defined by the E and Z directions (E-Z: oblique direction).

Figures 16, 17:
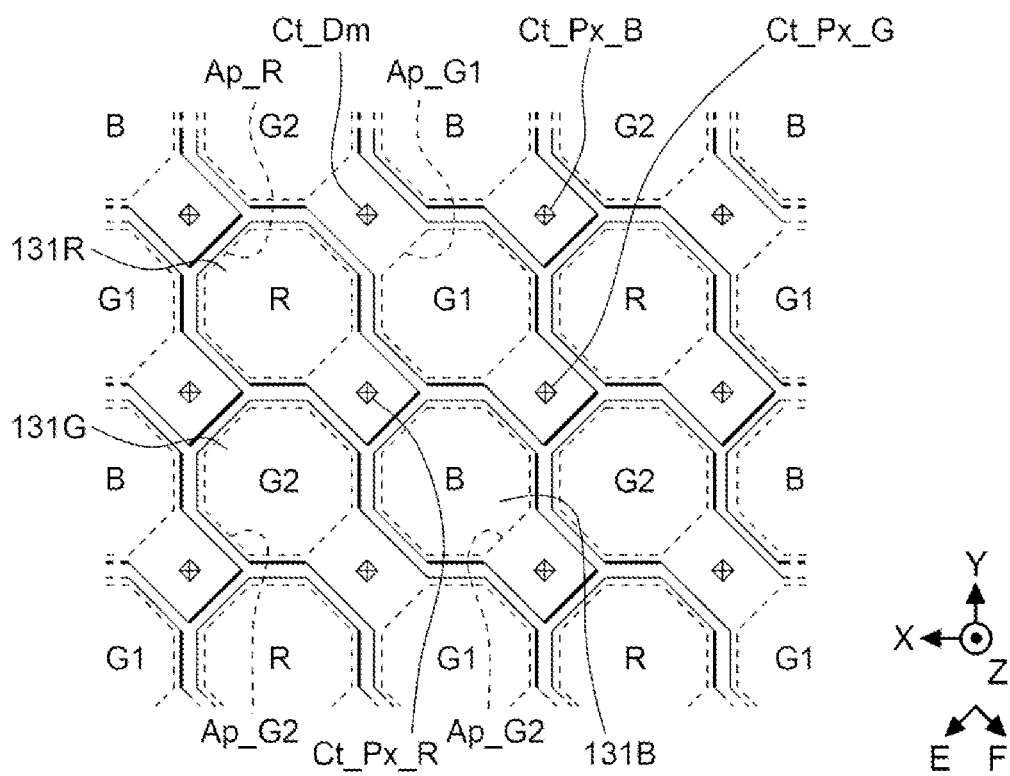
FIG. 16 is a diagram illustrating a comparison of a color change between the embodiment and the reference example.
FIG. 17 is a plan view illustrating an arrangement of a pixel electrode according to a first modified example.

FIG. 16 is a table illustrating results of measuring the color difference between the present embodiment and the reference example in the longitudinal direction, the transverse direction, and the oblique direction.

As illustrated in the table, in the reference example, the color difference is less than 0.02 in the longitudinal direction and the transverse direction, whereas it is greater than 0.02 in the oblique direction. On the other hand, in the present embodiment, the color difference is less than 0.02 in any of the longitudinal, transverse and oblique directions.

Thus, in the present embodiment, even when the viewing angle of the display region 100 changes, the color change is small as compared with the reference example.

As described above, the optical distances LR, LG, and LB in the optical resonator is LR>LG>LB.

If the light-emitting region B having the smallest optical distance and the light-emitting region R having the largest optical distance are adjacent to each other when seen in the X and Y directions, a large step is generated at a boundary between the light-emitting regions B and R.

When there is a large step at the boundary between the light-emitting regions, due to the step, the light-emitting layer 132 is locally thinned, resistance is lowered, and the current easily leaks. When a leakage current flows in the light-emitting layer 132, unintended light emission occurs, and a color gamut of a display image is narrowed.

In particular, in a micro display panel as in the present embodiment, the light-emitting region (the opening portion) is small, and thus the effect of the step is increased. The light emission due to leakage current tends to occur in a highly efficient manner, that is, in a red color that emits light even with a small current.

On the other hand, according to the present embodiment, in the Y direction, the light-emitting regions G1 and B are adjacent to each other, and the light-emitting regions R and G2 are adjacent to each other. In the X direction, the light-emitting regions R and G1 are adjacent to each other, and the light-emitting regions G2 and B are adjacent to each other. That is, in the present embodiment, when seen in the X direction and the Y direction, the light-emitting region B having the smallest optical distance and the light-emitting region R having the largest optical distance are not adjacent to each other. Further, in the present embodiment, when seen in the E direction and the F direction, the light-emitting regions B and R are adjacent to each other via the contact region Ct_Px_G or the dummy contact region Ct_Dm. Thus, according to the present embodiment, the light-emitting layer 132 is prevented from being locally thinned due to the step in the light-emitting region, and thus abnormal light emission due to the flowing of the leakage current is suppressed, and it is possible to avoid the narrowing of the color gamut of the displayed image.

Modified Example

The embodiments exemplified above can be variously modified. Specific modification aspects that may be applied to the embodiments are exemplified below. Two or more embodiments arbitrarily selected from the following examples may be combined to the extent that mutual contradiction does not arise.

The positional relationship between the light-emitting region and the contact region in each of the pixel portions 110R, 110G, and 110B is not limited to the embodiment illustrated in FIG. 6, and may be a positional relationship in a first modified example, a second modified example, and a third modified example as described below.

FIG. 17 is a plan view illustrating an arrangement of the pixel electrodes 131R, 131G, and 131B according to the first modified example.

The first modified example is an example in which the contact region is located in the F direction with respect to the light-emitting region. Specifically, in the first modified example, the contact region Ct_Px_R is located in the F direction with respect to the light-emitting region R, the contact region Ct_Px_B is located in the F direction with respect to the light-emitting region G1, and the dummy contact region Ct_Dm is located in the F direction with respect to the light-emitting region G2, and the contact region Ct_Px_B is located in the F direction with respect to the light-emitting region B.

In the first modified example, the arrangement of the coloring layers Cf_R, Cf_G, and Cf_B is common to FIG. 7 in the embodiment. Thus, in the first modified example, the region Bb1 overlaps the contact region Ct_Px_R in plan view, and the region Bb2 overlaps the contact region Ct_Px_G in plan view.

Figure 18:
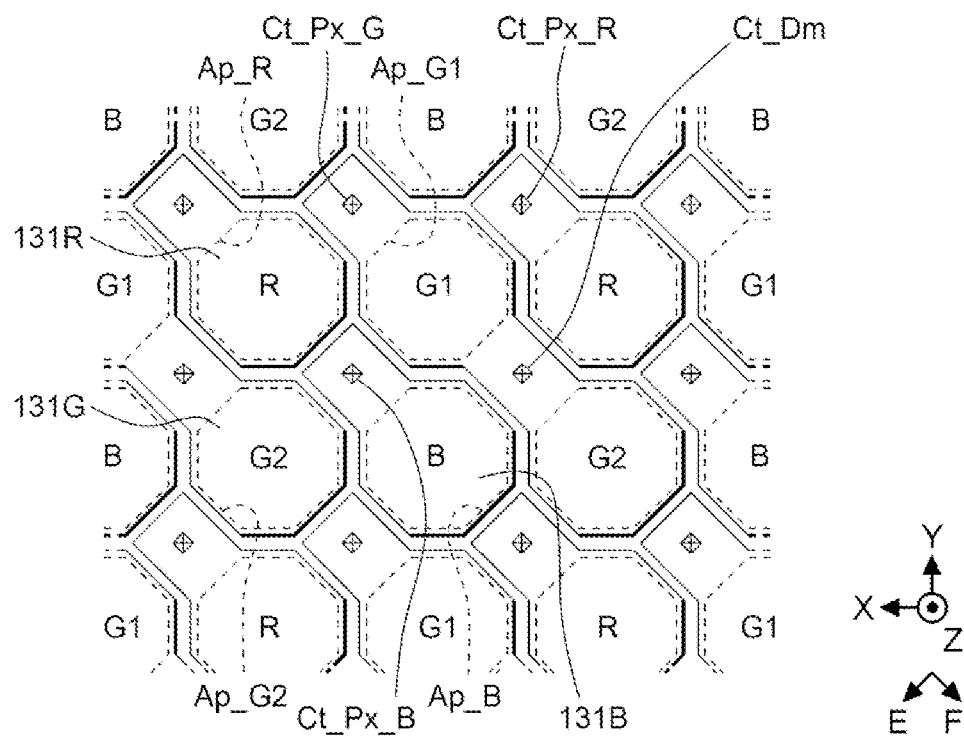
FIG. 18 is a plan view illustrating an arrangement of a pixel electrode according to a second modified example.

FIG. 18 is a plan view illustrating an arrangement of the pixel electrodes 131R, 131G, and 131B, and the like according to the second modified example.

The second modified example is an example in which the contact region is located in a direction opposite to the F direction with respect to the light-emitting region. Specifically, in the second modified example, the contact region Ct_Px_R is located in the direction opposite to the F direction with respect to the light-emitting region R, the contact region Ct_Px_B is located in the direction E in the direction opposite to the F direction with respect to the light-emitting region G1, the dummy contact region Ct_Dm is located in the direction opposite to the direction of the F direction with respect to the light-emitting region G2, and the contact region Ct_Px_B is located in the direction opposite to the F direction with respect to the light-emitting region B.

In the second modified example, the arrangement of the coloring layers Cf_R, Cf_G, and Cf_B is common to FIG. 7 in the embodiment. Thus, in the second modified example, the region Bb1 overlaps the contact region Ct_Px_B in plan view, and the region Bb2 overlaps the dummy contact region Ct_Dm in plan view.

Although not specifically illustrated, the contact region may be located in the E direction with respect to the light-emitting region. However, when the contact region is located in the E direction with respect to the light-emitting region, the region Bb1 overlaps the dummy contact region Ct_Dm in plan view similarly to the embodiment, and the region Bb2 overlaps the contact region Ct_Px_R in plan view.

Figure 19:
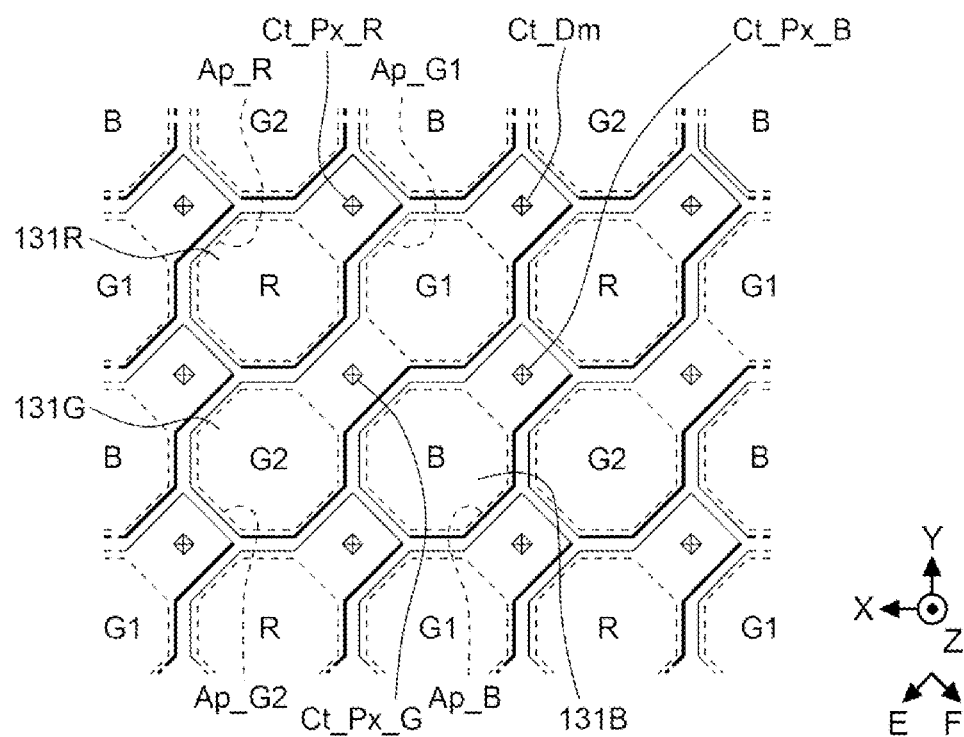
FIG. 19 is a plan view illustrating an arrangement of a pixel electrode according to a third modified example.

FIG. 19 is a plan view illustrating an arrangement of the pixel electrodes 131R, 131G, and 131B, and the like according to the third modified example. The third modification has a relationship in which the contact region Ct_Px_G and the dummy contact region Ct_Dm in the embodiment are interchanged with each other in the pixel portion 110G.

In the third modified example, the arrangement of the coloring layers Cf_R, Cf_G, and Cf_B is common to FIG. 7 in the embodiment. Thus, in the third modified example, the region Bb1 overlaps the contact region Ct_Px_G in plan view, and the region Bb2 overlaps with the contact region Ct_Px_B in plan view.

Figure 20:
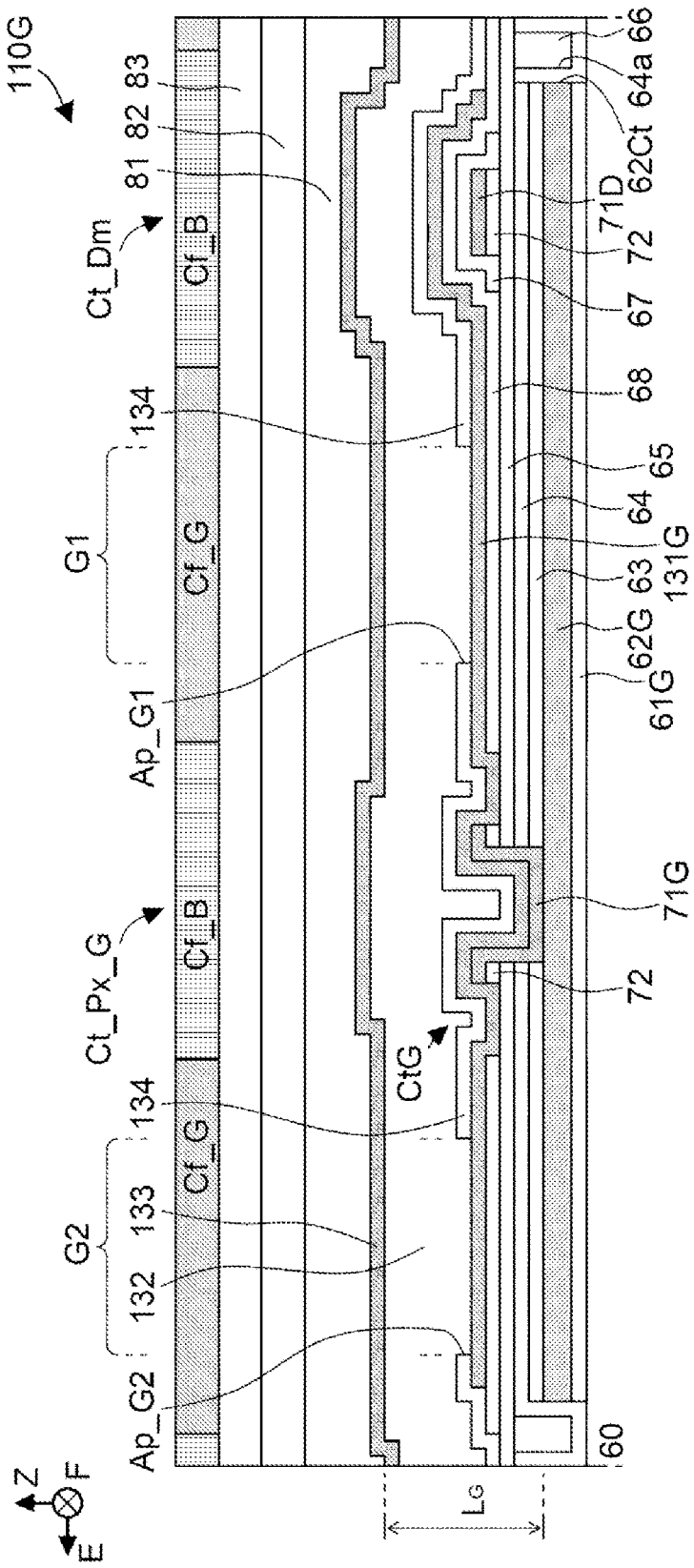
FIG. 20 is a cross-sectional view of a main portion of a pixel portion in the third modified example.
Figure 21:
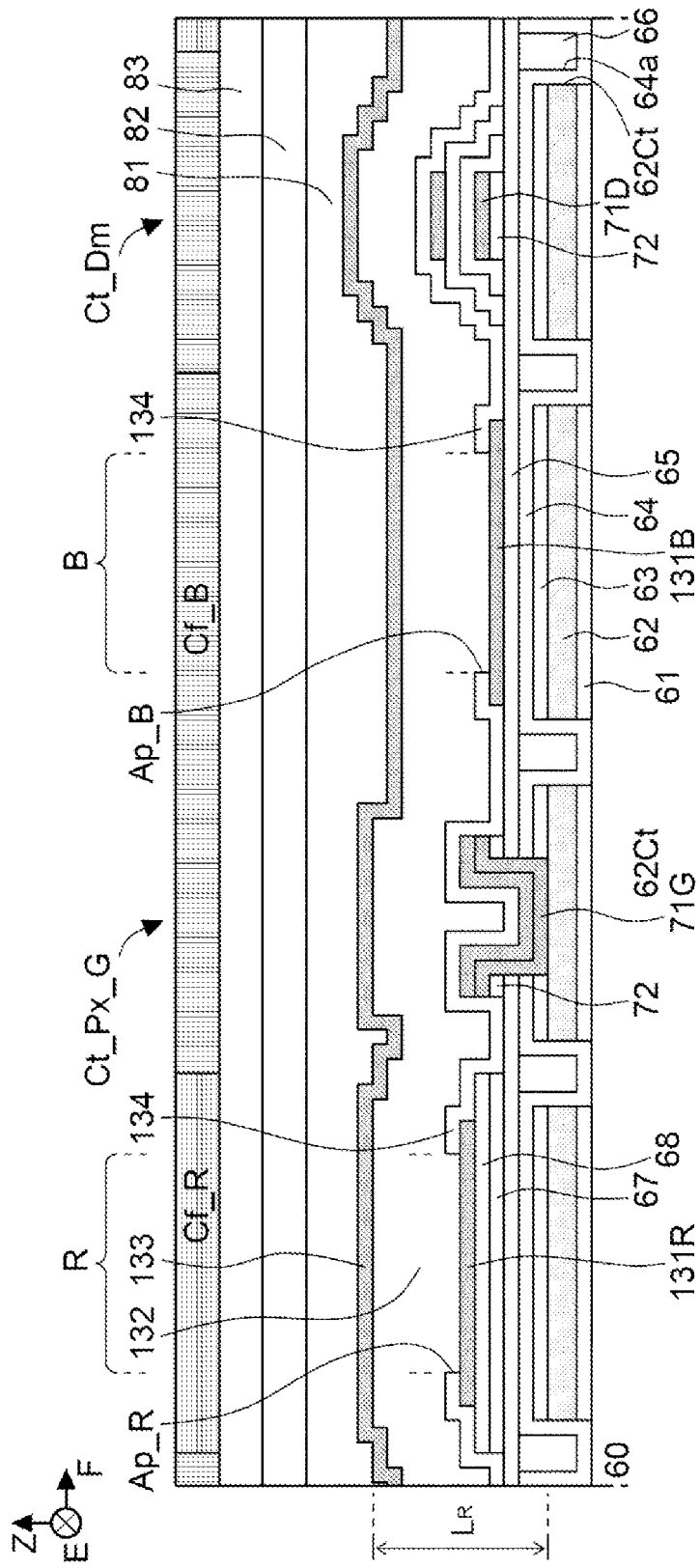
FIG. 21 is a cross-sectional view of a main portion of the pixel portion in the third modified example.

FIG. 20 is a cross-sectional view when a region including the light-emitting region G2, the contact region Ct_Px_G, the light-emitting region G1 and the dummy contact region Ct_Dm is cut in the E direction in the third modified example. FIG. 21 is a cross-sectional view when a region including the light-emitting region R, the contact region Ct_Px_G, the light-emitting region R, and the dummy contact region Ct_Dm is cut in the F direction in the third modified example.

FIG. 20 is in a relationship in which the dummy contact region Ct_Dm and the contact region Ct_Px_G in FIG. 10 are interchanged with each other, and FIG. 21 is similarly in a relationship in which the dummy contact region Ct_Dm and the contact region Ct_Px_G in FIG. 12 are interchanged with each other. Therefore, the detailed description thereof will be omitted.

Although not illustrated, in the second modified example, the contact region Ct_Px_G and the dummy contact region Ct_Dm may be interchanged with each other in the pixel portion 110G. In such a configuration, the region Bb2 overlaps the contact region Ct_Px_G corresponding to the light-emitting region G2 with a reference sign Fi attached in plan view.

Areas of the light-emitting regions R, G1, G2, and B in plan view do not have to be equal to each other. As described above, this is because the area of each of the light-emitting regions has properties that are determined in consideration of light emission efficiency, visibility, life of the light-emitting layer, and the like.

Figure 22:
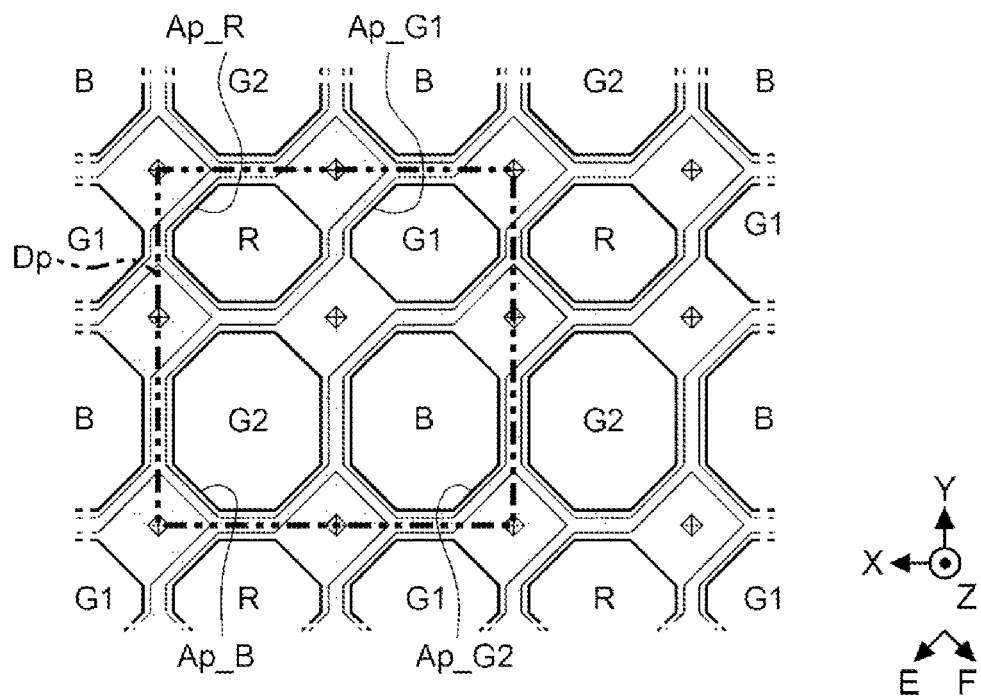
FIG. 22 is a plan view illustrating a light-emitting region of a pixel portion according to a fourth modified example.

Thus, as illustrated in the fourth modified example illustrated in FIG. 22, area of light-emitting region R <area of light-emitting region B <Sum of areas of light-emitting regions G1 and G2

The reason why the area of each of the light-emitting regions has such a relationship is because, since the light emission efficiency of red is highest in red, green and blue, the area thereof may be minimal, while green has high visibility and the area thereof is maximized to ensure the life to withstand overuse.

In the present embodiment, the OLED is used as an example of the light-emitting element, but the present disclosure is not limited thereto, and an inorganic EL element using an inorganic material, or a pLED element may be used.

Electronic Apparatus

Next, an electronic apparatus to which the electro-optical device 10 according to the embodiment and the first to fourth modified examples is applied will be described. The electro-optical device 10 is suitable for application with a small pixel and high definition display. Therefore, a head-mounted display will be described as an example of the electronic apparatus.

Figure 23:
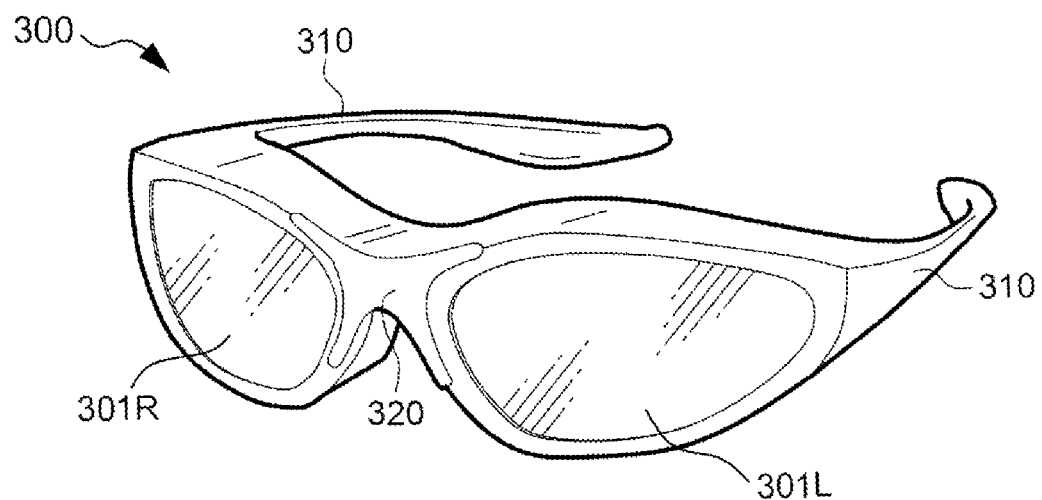
FIG. 23 is a perspective view illustrating a head-mounted display using an electro-optical device.
Figure 24:
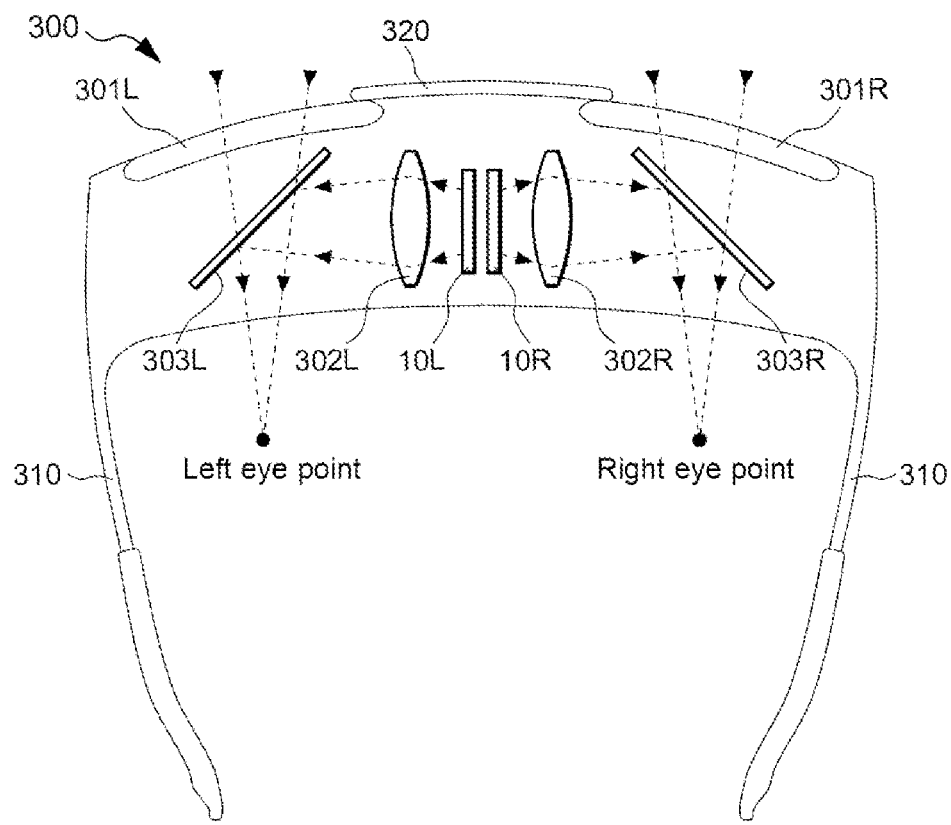
FIG. 24 is a diagram illustrating an optical configuration of the head-mounted display.

FIG. 23 is a view illustrating an exterior of a head-mounted display, and FIG. 24 is a view illustrating an optical configuration of the head-mounted display.

First, as illustrated in FIG. 23, a head-mounted display 300 includes, in terms of exterior, temples 310, a bridge 320, and lenses 301L and 301R, similar to typical eye glasses. In addition, as illustrated in FIG. 24, in the head-mounted display 300, an electro-optical device 10L for a left eye and an electro-optical device 10R for a right eye are provided in the vicinity of the bridge 320 and on the back side (the lower side in the drawing) of the lenses 301L and 301R.

An image display surface of the electro-optical device 10L is disposed to be on the left side in FIG. 24. Thus, a display image by the electro-optical device 10L is output via an optical lens 302L in a 9-o'clock direction in the drawing. A half mirror 303L reflects the display image by the electro-optical device 10L in a 6-o'clock direction, while the half mirror 303L transmits light incident in a 12-o'clock direction. An image display surface of the electro-optical device 10R is disposed on the right side opposite to the electro-optical device 10L. Thus, the display image by the electro-optical device 10R is output via the optical lens 302R in a 3-o'clock direction in the drawing. A half mirror 303R reflects the display image by the electro-optical device 10R in a 6-o'clock direction, while the half the mirror 303R transmits light incident in a 12-o'clock direction.

In this configuration, a wearer of the head-mounted display 300 can observe the display images by the electro-optical devices 10L and 10R in a see-through state in which the display images by the electro-optical devices 10L and 10R overlap the outside.

In addition, in the head-mounted display 300, in the images for both eyes with parallax, an image for a left eye is displayed on the electro-optical device 10L, and an image for a right eye is displayed on the electro-optical device 10R, and thus, it is possible to cause the wearer to sense the displayed images as an image displayed having a depth or a three-dimensional effect.

In addition to the head mounted display 300, the electric apparatus including the electro-optical device 10 can be applied to an electronic viewing finder in a video camera, a lens-exchangeable digital camera, or the like, a mobile information terminal, a wristwatch display, a light valve for a projection type projector, and the like.

Supplementary Note

Preferred aspects of the present disclosure are understood from the above description, as follows. In the following, in order to facilitate understanding of each of the aspects, the reference signs of the drawings are provided in parentheses for convenience, but the present disclosure is not intended to be limited to the illustrated aspects.

Appendix 1

The electro-optical device (10) according to one aspect (aspect 1) includes, in plan view, a first light-emitting region (B) that emits light in a first wavelength range, a first coloring layer (Cf_B) that transmits the light in the first wavelength range, a second light-emitting region (G1) that is disposed adjacent to the first light-emitting region (B) in a first direction and emits light in a second wavelength range, a second coloring layer (Cf_G) that is provided overlapping the second light-emitting region (G1) and transmits the light in the second wavelength range, a third light-emitting region (R) that is disposed adjacent to the second light-emitting region (G1) in a second direction and emits light in a third wavelength range, a third coloring layer (Cf_R) that is provided overlapping the third light-emitting region and transmits the light in the third wavelength range, a fourth light-emitting region (G2) that is disposed adjacent to the second light-emitting region in a third direction intersecting the first direction and the second direction and emits the light in the second wavelength range, and a fourth coloring layer (Cf_G) that is provided overlapping the fourth light-emitting region and transmits the light in the second wavelength range, wherein the first coloring layer (Cf_B) includes a first region (Ba) that overlaps the first light-emitting region in plan view, and a second region (Bb1) located between the second light-emitting region (G1) and the fourth light-emitting region (G2) in plan view.

In aspect 1, the second region (Bb1) of the first light-emitting layer (CCF_B) that transmits light in a wavelength range different from that of the second light-emitting region (G1) or the fourth light-emitting region (G2) is provided between the second light-emitting region (G1) and the fourth light-emitting region (G2) adjacent in the third direction. Thus, the light in the second wavelength range emitted in an oblique direction along the third direction is shielded by the first light-emitting layer (Cf_B). Thus, according to aspect 1, a degree of color change can be made uniform when seen in a direction of a row or column (the second direction or the first direction) and when seen in the oblique direction (the third direction).

The Y direction is an example of the first direction, the X direction is an example of the second direction, and the E direction is an example of the third direction. The light-emitting region B is an example of the first light-emitting region, the light-emitting region G1 is an example of the second light-emitting region, and the light-emitting region R is an example of the third light-emitting region, and the light-emitting region G2 is an example of the fourth light-emitting region.

The coloring layer Cf_B is an example of the first coloring layer, and the coloring layer Cf_G is an example of the second coloring layer, and the coloring layer Cf_R is an example of the third coloring layer. The region Ba is an example of a first region, and the region Bb1 is an example of a first light-shielding region.

Appendix 2

In the electro-optical device (10) according to a specific aspect (aspect 2) of aspect 1, the first wavelength range has a shorter wavelength range than the second wavelength range and the third wavelength range.

According to aspect 2, the light in the second wavelength range emitted from the second light-emitting region (G1) or the fourth light-emitting region (G2) in the third direction can be more reliably shielded by the first light-emitting layer (Cf_B) having a shorter wavelength.

Appendix 3

The electro-optical device (10) according to a specific aspect (aspect 3) of aspect 1 or 2 includes a first light-emitting element (130B) including a common electrode (133), a first pixel electrode (131B), and a light-emitting layer (132), a first relay electrode (71B) electrically coupled to the first pixel electrode (131B), a second light-emitting element (131G) including the common electrode (133), a second pixel electrode (131G), and the light-emitting layer (132), a second relay electrode (71G) electrically coupled to the second pixel electrode (131G), a third light-emitting element (130R) including the common electrode (133), a third pixel electrode (131R), and the light-emitting layer (132), and a third relay electrode (71R) electrically coupled to the third pixel electrode (131R), wherein the first light-emitting element (130B) emits the light in the first wavelength region from the first light-emitting region (B), the second light-emitting element (130G) emits the light in the second wavelength region from the second light-emitting region (G1) and the fourth light-emitting region (G2), the third light-emitting element (130R) emits the light in the third wavelength region from the third light-emitting region (R), the first light-emitting region (B) is a region in which the first pixel electrode (131B) and the light-emitting layer (132) are in contact, each of the second light-emitting region (G1) and the fourth light-emitting region (G2) is a region in which the second pixel electrode (131G) and the light-emitting layer (132) are in contact, and the third light-emitting region (R) is a region in which the third pixel electrode (131R) and the light-emitting layer (132) are in contact.

The pixel electrode 131B is an example of the first pixel electrode, and the pixel electrode 131G is an example of the second pixel electrode, and the pixel electrode 131R is an example of the third pixel electrode. The relay electrode 71B is an example of the first relay electrode, and the relay electrode 71G is an example of the second relay electrode, and the relay electrode 71R is an example of the third relay electrode.

Appendix 4

In the electro-optical device (10) according to a specific aspect (aspect 4) of aspect 3, in plan view, the second region (Bb1) overlap any one of a first contact region (Ct_Px_B) to which the first pixel electrode (131B) and the first relay electrode (71B) are coupled, a second contact region (Ct_Px_G) to which the second pixel electrode (131G) and the second relay electrode (71G) are coupled, and a third contact region (Ct_Px_R) to which the third relay electrode (131R) and the third relay electrode (71R) are coupled.

The contact region Ct_Px_B is an example of the first contact region, and the contact region Ct_Px_G is an example of the second contact region, and the contact region Ct_Px_R is an example of the third contact region.

Appendix 5

In the electro-optical device (10) according to a specific aspect (aspect 5) of aspect 3 or 4, the first relay electrode (71B) is electrically coupled to a first reflective electrode (62B) and is provided between the first reflective electrode (62B) and the first pixel electrode (131B) in cross-sectional view, the second relay electrode (71G) is electrically coupled to a second reflective electrode (62G) and is provided between the second reflective electrode (62G) and the second pixel electrode (131G) in cross-sectional view, the third relay electrode (71R) is electrically coupled to a third reflective electrode (62R) and is provided between the third reflective electrode (62R) and the third pixel electrode (131R) in cross-sectional view, in the first light-emitting region (B), a first distance (LB) from the first reflective electrode (62B) to the common electrode (133) in cross-sectional view is a distance corresponding to the first wavelength region, in the second light-emitting region (G), a second distance (LG) from the second reflective electrode (62G) to the common electrode (133) in cross-sectional view is a distance corresponding to the first wavelength region, in the third light-emitting region, a third distance (LR) from the third reflective electrode (62R) to the common electrode (133) in cross-sectional view is a distance corresponding to the third wavelength region, and first distance <second distance <third distance.

According to aspect 5, light corresponding to the wavelength range is emitted by an optical resonator.

The reflective electrode 62B is an example of the first reflective electrode, and the reflective electrode 62G is an example of the second reflective electrode, and the reflective electrode 62R is an example of the third reflective electrode. The optical distance LB is an example of the first distance, and the optical distance LG is an example of the second distance, and the optical distance LR is an example of the third distance.

Appendix 6

In the electro-optical device (10) according to a specific aspect (aspect 6) of aspect 5, the first light-emitting region (B) and the third light-emitting region (R) are not adjacent to each other in the first direction and the second direction in plan view.

According to aspect 6, a difference between the first distance (LB) and the third distance (LR) which are optical path lengths in the optical resonator is the largest. Since the first light-emitting region (B) and the third light-emitting region (R) having a large difference in the optical path length are not adjacent in the first direction and the second direction in plan view, a step generated by the optical resonator can be suppressed to a small size.

Appendix 7

In the electro-optical device (10) according to any specific aspect (aspect 6) of aspects 1 to 6, in plan view, a fifth light-emitting region (G2) that is disposed adjacent to the second light-emitting region (G1) in a fourth direction intersecting the third direction and emits the light in the second wavelength range, and a fifth coloring layer (Cf_G) that is provided overlapping the fifth light-emitting region (G2) and transmits the light in the second wavelength range are further included, and the first coloring layer (Cf_B) includes a third region (Bb2) located between the second light-emitting region (G1) and the fifth light-emitting region (G2) in plan view.

According to aspect 4, the degree of color change can be made uniform when seen in a direction of a row or column (the second direction or the first direction) and when seen in the fourth direction. The F direction is an example of the fourth direction. The light-emitting region G2 with a reference sign Fi is an example of the fifth light-emitting region, and the region Bb2 is an example of the third region.

In aspect 7, a fifth light-emitting element (130 G) including the common electrode (133), a fifth pixel electrode (131G), and the light-emitting layer (132) is further included, the fifth light-emitting is a region in which the fifth pixel electrode (131G) and the light-emitting layer (132) are in contact, the fifth pixel electrode (131G) and the fifth relay electrode (71G) are coupled by a fourth contact region (Ct_Px_G), and the third region (Bb2) overlaps any of the first to fourth contact regions in plan view.

Appendix 8

In the electro-optical device (10) according to any specific aspect of aspects 1 to 7, in plan view, the second region (Bb1) is provided in contact with the second coloring layer (Cf_G), the third coloring layer (Cf_R), and the fourth coloring layer (Cf_G), and the second coloring layer (Cf_G) and the fourth coloring layer (Cf_G) are not in contact.

Appendix 9

An electronic apparatus (300) according to aspect 9 includes an electro-optical device (10) according to any one of aspects 1 to 8.

What is claimed is:
1. An electro-optical device comprising:
   in plan view,
   a first light-emitting region configured to emit light in a first wavelength range;
   a first coloring layer configured to transmit the light in the first wavelength range;
   a second light-emitting region disposed adjacent to the first light-emitting region in a first direction and configured to emit light in a second wavelength range:
   a second coloring layer provided overlapping the second light-emitting region and configured to transmit the light in the second wavelength range;
   a third light-emitting region disposed adjacent to the second light-emitting region in a second direction and configured to emit light in a third wavelength range;
   a third coloring layer provided overlapping the third light-emitting region and configured to transmit the light in the third wavelength range;
   a fourth light-emitting region disposed adjacent to the second light-emitting region in a third direction intersecting the first direction and the second direction and configured to emit the light in the second wavelength range; and a fourth coloring layer provided overlapping the fourth light-emitting region and configured to transmit the light in the second wavelength range, wherein the first coloring layer includes a first region that overlaps the first light-emitting region in plan view, and a second region located between the second light-emitting region and the fourth light-emitting region in plan view.

2. The electro-optical device according to claim 1, wherein the first wavelength range is a shorter wavelength range than the second wavelength range and the third wavelength range.

3. The electro-optical device according to claim 1, comprising:

a first light-emitting element including a common electrode, a first pixel electrode, and a light-emitting layer;

a first relay electrode electrically coupled to the first pixel electrode;

a second light-emitting element including the common electrode, a second pixel electrode, and the light-emitting layer;

a second relay electrode electrically coupled to the second pixel electrode;

a third light-emitting element including the common electrode, a third pixel electrode, and the light-emitting layer; and a third relay electrode electrically coupled to the third pixel electrode, wherein the first light-emitting element emits the light in the first wavelength region from the first light-emitting region, the second light-emitting element emits the light in the second wavelength region from the second light-emitting region and the fourth light-emitting region, the third light-emitting element emits the light in the third wavelength region from the third light-emitting region, the first light-emitting region is a region in which the first pixel electrode and the light-emitting layer are in contact, each of the second light-emitting region and the fourth light-emitting region is a region in which the second pixel electrode and the light-emitting layer are in contact, and the third light-emitting region is a region in which the third pixel electrode and the light-emitting layer are in contact.

4. The electro-optical device according to claim 3, wherein, in plan view, the second region overlaps any one of a first contact region to which the first pixel electrode and the first relay electrode are coupled, a second contact region to which the second pixel electrode and the second relay electrode are coupled, and a third contact region to which the third relay electrode and the third relay electrode are coupled.

5. The electro-optical device according to claim 3, wherein the first relay electrode is electrically coupled to a first reflective electrode and is provided between the first reflective electrode and the first pixel electrode in cross-sectional view, the second relay electrode is electrically coupled to a second reflective electrode and is provided between the second reflective electrode and the second pixel electrode in cross-sectional view, the third relay electrode is electrically coupled to a third reflective electrode and is provided between the third reflective electrode and the third pixel electrode in cross-sectional view, in the first light-emitting region, a first distance from the first reflective electrode to the common electrode in cross-sectional view is a distance corresponding to the first wavelength region, in the second light-emitting region, a second distance from the second reflective electrode to the common electrode in cross-sectional view is a distance corresponding to the first wavelength region, in the third light-emitting region, a third distance from the third reflective electrode to the common electrode in cross-sectional view is a distance corresponding to the third wavelength region, and first distance <second distance <third distance.

6. The electro-optical device according to claim 5, wherein the first light-emitting region and the third light-emitting region are not adjacent to each other in the first direction and the second direction in plan view.

7. The electro-optical device according to claim 1, comprising:

in plan view, a fifth light-emitting region disposed adjacent to the second light-emitting region in a fourth direction intersecting the third direction and configured to emit the light in the second wavelength range; and a fifth coloring layer provided overlapping the fifth light-emitting region and configured to transmit the light in the second wavelength range, wherein the first coloring layer includes a third region located between the second light-emitting region and the fifth light-emitting region in plan view.

8. The electro-optical device according to claim 1, wherein, in plan view, the second region is provided in contact with the second coloring layer, the third coloring layer, and the fourth coloring layer, and the second coloring layer and the fourth coloring layer are not in contact.

9. An electronic apparatus comprising the electro-optical device according to claim 1.

* * * * *